United States Patent
Hirokawa et al.

(10) Patent No.: US 7,547,242 B2
(45) Date of Patent: *Jun. 16, 2009

(54) SUBSTRATE POLISHING APPARATUS

(75) Inventors: Kazuto Hirokawa, Tokyo (JP); Yoichi Kobayashi, Tokyo (JP); Shunsuke Nakai, Tokyo (JP); Shinrou Ohta, Tokyo (JP); Yasuo Tsukuda, Osaka (JP)

(73) Assignees: Ebara Corporation, Tokyo (JP); Shimadzu Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/558,257

(22) PCT Filed: May 19, 2004

(86) PCT No.: PCT/JP2004/007152
§ 371 (c)(1),
(2), (4) Date: Apr. 18, 2006

(87) PCT Pub. No.: WO2004/103636
PCT Pub. Date: Dec. 2, 2004

(65) Prior Publication Data
US 2007/0042679 A1  Feb. 22, 2007

(30) Foreign Application Priority Data
May 21, 2003 (JP) .............................. 2003-143526
May 21, 2003 (JP) .............................. 2003-143527

(51) Int. Cl.
B24B 49/00 (2006.01)
B24B 29/00 (2006.01)

(52) U.S. Cl. ................ 451/6; 451/5; 451/285

(58) Field of Classification Search ............ 451/6, 451/9–11, 5, 8, 285–289
See application file for complete search history.

(56) References Cited

U.S. PATENT DOCUMENTS

| 5,657,123 | A |   | 8/1997  | Mogi et al. |
| 5,672,091 | A |   | 9/1997  | Takahashi et al. |
| 5,762,536 | A | * | 6/1998  | Pant et al. ............ 451/6 |
| 5,838,447 | A |   | 11/1998 | Hiyama et al. |
| 5,893,796 | A |   | 4/1999  | Birang et al. |
| 5,958,148 | A |   | 9/1999  | Holzapfel et al. |
| 6,000,996 | A |   | 12/1999 | Fujiwara |

(Continued)

FOREIGN PATENT DOCUMENTS

EP    1 108 979 A2    6/2001

(Continued)

*Primary Examiner*—Lee D Wilson
(74) *Attorney, Agent, or Firm*—Wenderoth, Lind & Ponack, L.L.P.

(57) ABSTRACT

A substrate polishing apparatus polishes a substrate to a flat mirror finish. The substrate polishing apparatus has a polishing table against which a substrate is pressed, a light-emitting and light-receiving device to emit measurement light from the polishing table to the substrate and to receive reflected light from the substrate for measuring a film on the substrate, a fluid supply passage for supplying a measurement fluid, through which the measurement light and the reflected light pass, to a fluid chamber provided at a light-emitting and light-receiving position of the polishing table, and a fluid supply control device for controlling supply of the measurement fluid to the fluid chamber.

18 Claims, 30 Drawing Sheets

U.S. PATENT DOCUMENTS

| | | |
|---|---|---|
| 6,045,439 A | 4/2000 | Birang et al. |
| 6,106,662 A | 8/2000 | Bibby, Jr. et al. |
| 6,334,807 B1 | 1/2002 | Lebel et al. |
| 6,361,646 B1 | 3/2002 | Bibby, Jr. et al. |
| 6,433,541 B1 | 8/2002 | Lehman et al. |
| 6,491,569 B2 | 12/2002 | Bibby, Jr. et al. |
| 6,537,133 B1 | 3/2003 | Birang et al. |
| 6,544,104 B1 | 4/2003 | Koike et al. |
| 6,599,765 B1 * | 7/2003 | Boyd et al. ............... 438/16 |
| 6,614,529 B1 | 9/2003 | Tang |
| 6,621,264 B1 | 9/2003 | Lehman et al. |
| 6,628,397 B1 * | 9/2003 | Nikoonahad et al. ....... 356/445 |
| 6,671,051 B1 | 12/2003 | Nikoonahad et al. |
| 6,707,540 B1 * | 3/2004 | Lehman et al. ............. 356/72 |
| 6,733,368 B1 * | 5/2004 | Pan et al. .................. 451/36 |
| 6,758,723 B2 | 7/2004 | Kobayashi et al. |
| 6,785,010 B2 * | 8/2004 | Kimba et al. .............. 356/630 |
| 6,942,543 B2 * | 9/2005 | Kobayashi et al. .......... 451/6 |
| 7,101,257 B2 * | 9/2006 | Hirokawa et al. ........... 451/6 |
| 2001/0005265 A1 | 6/2001 | Kimba et al. |
| 2002/0016066 A1 | 2/2002 | Birang et al. |
| 2003/0181139 A1 * | 9/2003 | Lehman et al. ............. 451/8 |

FOREIGN PATENT DOCUMENTS

| | | |
|---|---|---|
| EP | 1 118 431 A2 | 7/2001 |
| JP | 10-229061 | 8/1998 |
| JP | 2001-88021 | 4/2001 |
| WO | 01/15861 | 3/2001 |
| WO | 01/20304 | 3/2001 |
| WO | 01/46684 | 6/2001 |
| WO | 01/81902 | 11/2001 |

* cited by examiner

F I G. 2
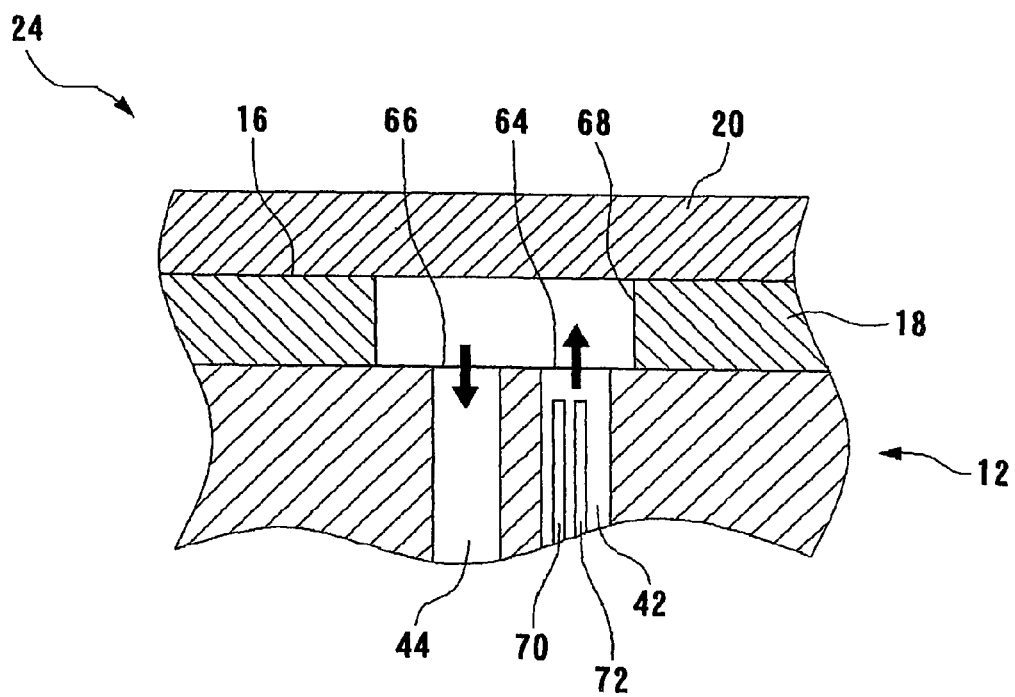

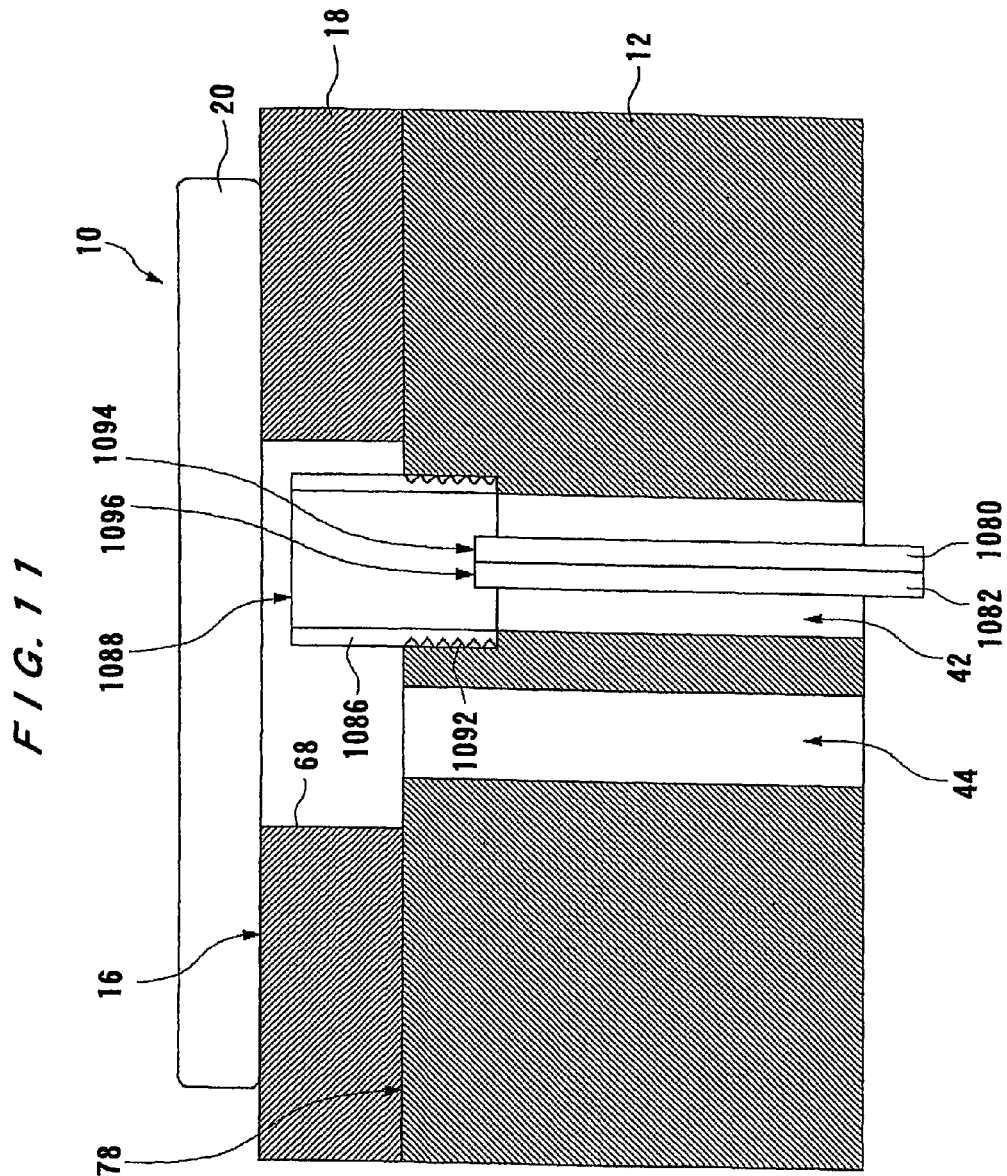

F I G. 20
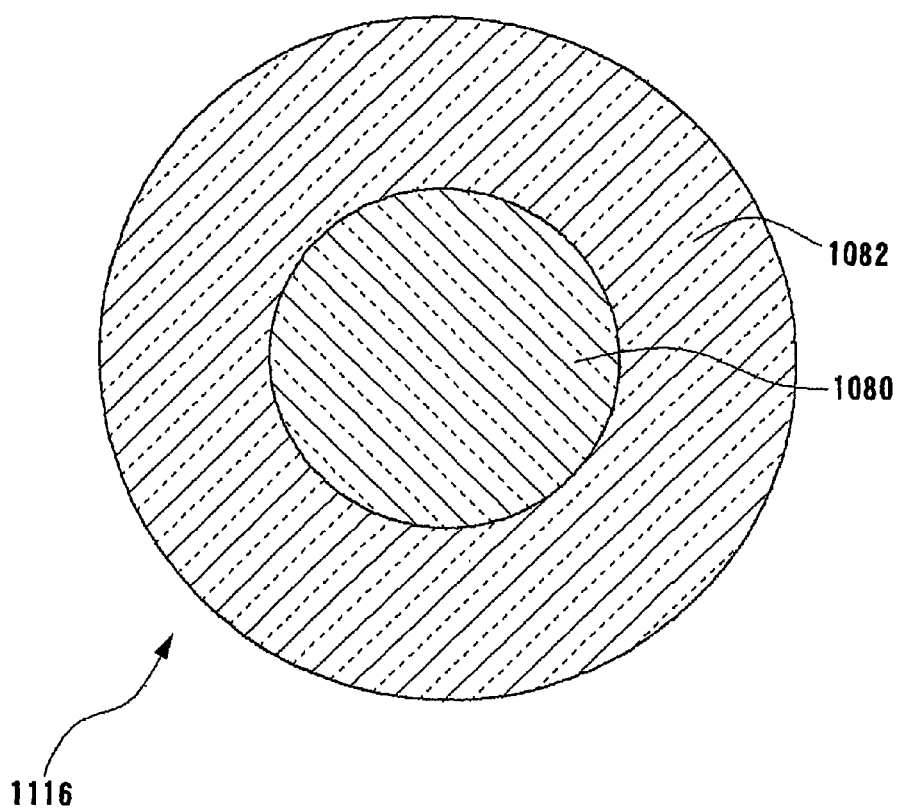

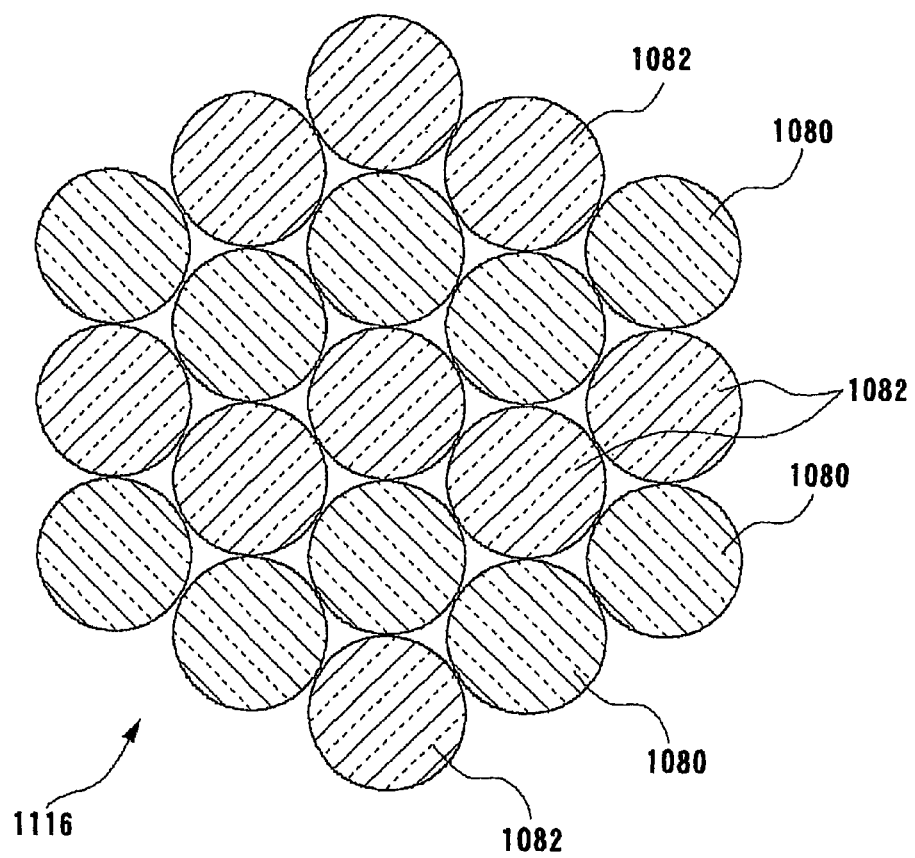
F I G. 2 5

SUBSTRATE POLISHING APPARATUS

TECHNICAL FIELD

The present invention relates to a substrate polishing apparatus having a substrate measuring device utilizing light, and more particularly to a substrate polishing apparatus capable of reducing influence on a polishing process from substrate measurement, and improving measurement accuracy of a substrate measuring device.

BACKGROUND ART

In a semiconductor fabrication process, a substrate polishing apparatus is used to polish a surface of a substrate such as a semiconductor wafer to a flat mirror finish. The substrate polishing apparatus includes a polishing table having a polishing surface thereon. A substrate is pressed against the polishing surface on the polishing table. Then, while a polishing abrasive is supplied onto the polishing surface, the polishing table is rotated to polish the substrate. There has been proposed a substrate measuring device utilizing light as a device for measuring a film on a substrate during a polishing process of the substrate. For example, a film thickness of a substrate is measured by a substrate measuring device, and an end point of a polishing process can be determined based on this measured film thickness.

As this type of substrate measuring device, there has been proposed a stream-type substrate measuring device. For example, Japanese laid-open patent publication No. 2001-235311 discloses a substrate measuring device having a water supply passage provided in a polishing table. The water supply passage has an outlet provided in a polishing surface, and pure water is ejected through the water supply passage to a substrate. Two optical fibers are disposed in a stream. Measurement light is emitted through one of the optical fibers to the substrate, and reflected light is received through the other of the optical fibers from the substrate. Then, a film thickness of the substrate is calculated based on the reflected light.

Thus, the stream-type substrate measuring device can supply water into a through-hole formed in a polishing pad. Accordingly, it is possible to dilute slurry flowing between the polishing table and the substrate into the through-hole, and to remove slurry attached to the substrate. Thus, influence on measurement from the slurry is reduced so as to maintain a required capability of measurement.

However, a large amount of water should be supplied in order to maintain a required capability of measurement. If water for measurement flows from the through-hole onto a surface (polishing surface) of the polishing pad, then slurry is diluted. Dilution of the slurry may have an influence on polishing performance.

Outflow of water will be described in greater detail. When the water supply passage is covered with the substrate, an amount of water outflow is relatively small. However, in most of conventional substrate polishing apparatuses, location of a substrate is positioned away from a rotational center of the polishing table, and the water supply passage is not continuously covered with the substrate. Specifically, according to rotation of the polishing table, there alternately appear periods of time during which the water supply passage is covered with the substrate and periods of time during which the water supply passage is not covered with the substrate. During a period of time during which the water supply passage is not covered with the substrate, the amount of water outflow is increased, thereby diluting the slurry so as to influence polishing performance.

In the aforementioned substrate polishing apparatus, an opening (outlet) is formed in the polishing surface to apply measurement light to the substrate, as described above. The opening formed in the polishing surface should preferably be as small as possible so as to reduce influence on a polishing process. In order to reduce a size of the opening, it is required to reduce a space for receiving the optical fibers. Under these circumstances, optical fibers having a small diameter have been used for film thickness measurement in a substrate polishing apparatus.

However, optical fibers having a small diameter emit and receive a small amount of light. Therefore, there has been desired a substrate polishing apparatus which can improve a ratio of an amount of received measurement light to an amount of emitted light (light-receiving efficiency).

SUMMARY OF THE INVENTION

The present invention has been made in view of the above background. It is, therefore, an object of the present invention to provide a substrate polishing apparatus which can reduce influence on a polishing performance from a measurement fluid, and enhance a light-receiving efficiency of measurement light.

In order to achieve the above object, according to a first aspect of the present invention, there is provided a substrate polishing apparatus characterized by comprising a polishing table against which a substrate is pressed; a light-emitting and light-receiving device to emit measurement light from the polishing table to the substrate and to receive reflected light from the substrate for measuring a film on the substrate; a fluid supply passage for supplying a measurement fluid to a fluid chamber provided at a light-emitting and light-receiving position of the polishing table, with the measurement light and the reflected light passing through the measurement fluid; and a fluid supply control device for controlling supply of the measurement fluid to the fluid chamber.

According to the present invention, since supply of the measurement fluid to the fluid chamber is controlled, fluid supply can be restricted within a range in which a measuring capability can be maintained. Therefore, an outflow of the measurement fluid can be reduced, and influence on a polishing performance from the measurement fluid can be reduced.

According to a preferred aspect of the present invention, the fluid supply control device controls supply of the measurement fluid to the fluid chamber according to a positional relationship between the fluid chamber and the substrate.

According to the present invention, supply of the measurement fluid is controlled according to the positional relationship between the fluid chamber and the substrate, so that fluid supply can be restricted within a range in which a measuring capability can be maintained. Therefore, an outflow of the measurement fluid can be reduced, and influence on a polishing performance from the measurement fluid can be reduced.

According to the present invention, for example, the fluid chamber is formed by a through-hole defined in a polishing pad on the polishing table. However, the fluid chamber is not limited thereto. Any fluid chamber may be used as long as it includes a space of an outlet portion of the fluid supply passage. Therefore, it is not necessary to clarify a boundary between the fluid chamber and the fluid supply passage. The fluid chamber may be formed by a region near an end of the fluid supply passage.

According to a preferred aspect of the present invention, the fluid supply control device ejects the measurement fluid to the fluid chamber during a blocking period during which the fluid chamber is blocked by the substrate.

The blocking period is defined as a period including at least a period during which the fluid chamber faces the substrate and during which measurement is performed. Since the fluid chamber is blocked by the substrate during the blocking period, an amount of outflow from the fluid chamber is small even if the measurement fluid is ejected. Therefore, the substrate can be measured while a large amount of measurement fluid is supplied with the amount of outflow being reduced.

Within the present invention, during any periods other than the blocking period, supply of the measurement fluid may be stopped to stop the outflow of the measurement fluid. However, supply at a low flow rate may be performed as follows.

According to a preferred aspect of the present invention, during an unblocking period during which the fluid chamber is not blocked by the substrate, the fluid supply control device supplies the measurement fluid to the fluid chamber at a flow rate lower than a flow rate during ejection.

According to the present invention, since a fluid is supplied to the fluid chamber at a low flow rate during the unblocking period, slurry is prevented from entering the fluid chamber during the unblocking period. Therefore, in an arrangement in which a fiber for measurement is provided, slurry is prevented from attaching to a surface of the fiber for measurement, particularly to an end of the fiber.

According to a preferred aspect of the present invention, the substrate polishing apparatus comprises a compulsory discharge control device for controlling compulsory discharge of a fluid in the fluid chamber according to the positional relationship between the fluid chamber and the substrate.

According to the present invention, since compulsory discharge of the fluid in the fluid chamber is controlled according to the positional relationship between the fluid chamber and the substrate, compulsory discharge can be performed within a range in which a measuring capability can be maintained. Therefore, an outflow of the measurement fluid can be reduced, and influence on a polishing performance from the measurement fluid can be reduced.

According to a preferred aspect of the present invention, the compulsory discharge control device compulsorily discharges the fluid in the fluid chamber during a blocking period during which the fluid chamber is blocked by the substrate.

According to the present invention, a large amount of fluid in the fluid chamber, which is supplied to the fluid chamber, can be compulsorily discharged during the blocking period to reduce the amount of outflow of the measurement fluid.

According to a preferred aspect of the present invention, the compulsory discharge control device continues compulsory discharge of the fluid in the fluid chamber during a predetermined post-blocking period after the blocking period is completed.

According to the present invention, compulsory discharge is continued during a post-blocking period after the blocking period is completed, so that the amount of outflow of the measurement fluid can be reduced during the post-blocking period.

According to a preferred aspect of the present invention, the compulsory discharge control device restricts compulsory discharge of the fluid in the fluid chamber during a predetermined pre-blocking period before the fluid chamber is blocked by the substrate.

According to the present invention, since compulsory discharge is restricted during the pre-blocking period, an amount of measurement fluid in the fluid chamber can be increased during the pre-blocking period to substantially fill the fluid chamber with the measurement fluid. Preferably, the fluid chamber is filled with the measurement fluid by fluid supply at a low flow rate. Thus, it is possible to reduce an amount of slurry flowing into the fluid chamber when the fluid chamber reaches slurry pools (in which slurry accumulates) immediately before the fluid chamber is moved below the substrate on the polishing table. Reduction of the amount of slurry flowing into the fluid chamber when the fluid chamber passes through the slurry pools can improve a measuring performance when the fluid chamber passes across the substrate.

Sizes of slurry pools differ according to specifications of the slurry, the polishing pad, and the like. The slurry pools may not be produced in some cases. In such a case, according to the present embodiment, before the fluid chamber has been blocked by the substrate, the amount of fluid in the fluid chamber is increased to improve the measuring performance. For example, it is possible to reduce bubbles involved when the fluid chamber moves below the substrate.

According to a second aspect of the present invention, there is provided a substrate polishing apparatus characterized by comprising a polishing table against which a substrate is pressed; a light-emitting and light-receiving device to emit light from the polishing table to the substrate and to receive reflected light from the substrate; a first passage for ejection, the first passage introducing a fluid, through which the light and the reflected light pass, to a fluid chamber provided at a light-emitting and light-receiving position of the polishing table; a second passage for a low flow rate, the second passage being restricted as compared to the first passage for ejection which introduces the fluid to the fluid chamber; and a switching device for switching the first and second passages into which the fluid is introduced.

According to the present invention, the first passage for ejection and the second passage for a low flow rate are switched. When ejection and low-flow-rate supply is switched, it is possible to obtain the above advantages of the present invention.

According to a third aspect of the present invention, there is provided a substrate polishing apparatus characterized by comprising a polishing table having a polishing surface against which a substrate is pressed; and a passage to supply a fluid to the polishing surface on the polishing table, wherein the passage includes a passage for a high flow rate and a passage for a low flow rate. According to the present invention, with passages for a high flow rate and for a low flow rate, the flow rate can suitably be controlled.

According to a preferred aspect of the present invention, the substrate polishing apparatus comprises a polishing table against which a substrate is pressed; a light-emitting and light-receiving device to emit measurement light from the polishing table to the substrate and to receive reflected light from the substrate for measuring a film on the substrate; a fluid supply passage for supplying a measurement fluid to a fluid chamber provided at a light-emitting and light-receiving position of the polishing table, with the measurement light and the reflected light passing through the measurement fluid; a fluid supply control device for controlling supply of the measurement fluid to the fluid chamber and switching an ejection mode in which the measurement fluid is ejected and a low-flow-rate mode in which a flow rate is lower than that in the ejection mode; and a compulsory discharge control device for controlling compulsory discharge of a fluid in the fluid chamber. During a blocking period during which the fluid chamber is blocked by the substrate, the fluid supply control device sets the ejection mode, and the compulsory discharge control device compulsorily discharges the fluid in the fluid chamber (measurement chamber). During a predetermined pre-blocking period before the fluid chamber is blocked by the substrate, the fluid supply control device sets the lowflow-rate mode, and the compulsory discharge control device restricts compulsory discharge of the fluid in the measurement chamber. During a predetermined post-blocking period after blocking of the fluid chamber by the substrate is completed, the fluid supply control device sets a low-flow-rate mode, and the compulsory discharge control device compulsorily discharges the fluid in the measurement chamber.

According to the present invention, compulsory discharge is performed together with ejection of the fluid during the blocking period. Therefore, measurement can be performed with a sufficient amount of measurement fluid while an amount of outflow is reduced. Further, during the pre-blocking period, supply at a low flow rate is performed, and compulsory discharge is restricted. Therefore, the amount of measurement fluid in the fluid chamber can be increased during the pre-blocking period, and it is possible to reduce the amount of slurry flowing into the fluid chamber when the measurement chamber passes through slurry pools immediately before the measurement chamber is moved below the substrate. Further, during the post-blocking period, supply at a low flow rate is performed, and compulsory discharge is performed. Therefore, slurry is prevented from entering the fluid chamber while the amount of outflow is reduced. Thus, according to the present invention, the amount of outflow of the measurement fluid is reduced while maintaining a measuring capability, and influence on a polishing performance be reduced.

According to a preferred aspect of the present invention, after a polishing process, the fluid supply control device sets the low-flow-rate mode, and the compulsory discharge control device restricts compulsory discharge of the fluid chamber.

According to the present invention, after a polishing process, supply at a low flow rate is performed, and compulsory discharge is restricted. Therefore, it is possible to maintain a state in which the measurement fluid is present in the fluid chamber.

According to a fourth aspect of the present invention, there is provided a substrate polishing apparatus characterized by comprising a polishing table having a polishing surface for polishing a semiconductor substrate; a light-emitting optical fiber which emits measurement light, for measuring a film of the semiconductor substrate, through an opening provided in the polishing surface to the semiconductor substrate; and a light-receiving optical fiber which receives the measurement light reflected from the semiconductor substrate, wherein an emitting end of the light-emitting optical fiber and an incident end of the light-receiving optical fiber are located adjacent each other, and a distance from the light-emitting optical fiber and the light-receiving optical fiber to the semiconductor substrate is determined based on an angle of divergence of the light-emitting optical fiber and an angle of divergence of the light-receiving optical fiber.

According to the present invention, with an arrangement in which the emitting end of the light-emitting optical fiber and the incident end of the light-receiving optical fiber are located adjacent each other, a path of the measurement light emitted from the light-emitting optical fiber and entering the light-receiving optical fiber is brought closer to being perpendicular to the substrate. Accordingly, it is possible to increase a quantity of light received by the light-receiving optical fiber.

Generally, in order to enhance a light-receiving efficiency of reflected light from a substrate, it is desirable that a distance from an emitting end of the light-emitting optical fiber and an incident end of the light-receiving optical fiber to the substrate is short. However, when the emitting end of the light-emitting optical fiber and the incident end of the light-receiving optical fiber is brought close to the substrate, an effective application area is reduced on the substrate. "Effective application area" is a range to which measurement light, that can reach a light-receiving optical fiber through reflection, is applied. According to the present invention, attention is drawn to the fact that an effective application area is influenced by an angle of divergence, which is one of characteristics of an optical fiber. A distance from the light-emitting optical fiber and the light-receiving optical fiber to the substrate is determined based on angles of divergence. Thus, a light-receiving efficiency of measurement light can be enhanced. "Angle of divergence" is a maximum angle at which an optical fiber can receive light, and is specified by an NA value, which is one of parameters representing characteristics of an optical fiber.

According to a preferred aspect of the present invention, a distance from the light-emitting optical fiber and the light-receiving optical fiber to the semiconductor substrate is determined based on a value L calculated by $$L=(1-N^2)^{1/2} \times (2T+C)/2N$$

where N is an NA value of the light-emitting optical fiber and the light-receiving optical fiber, C is a core diameter, and T is a thickness of a clad.

The value L calculated by the above formula represents a distance by which a light-emitting optical fiber and a light-receiving optical fiber can be brought close to a substrate without reducing an effective application area. Therefore, when the distance is set based on calculated value L, a light-receiving efficiency can be improved.

According to a preferred aspect of the present invention, the substrate polishing apparatus comprises light-emitting and light-receiving condensation structure for condensing measurement light emitted by the light-emitting optical fiber to the semiconductor substrate, and condensing measurement light reflected from the semiconductor substrate to the light-receiving optical fiber, with the light-emitting and light-receiving condensation structure being provided so as to cover an emitting end of the light-emitting optical fiber and an incident end of the light-receiving optical fiber.

According to a preferred aspect of the present invention, one of the light-emitting optical fiber and the light-receiving optical fiber is surrounded by the other of the light-emitting optical fiber and the light-receiving optical fiber.

According to a fifth aspect of the present invention, there is provided a substrate polishing apparatus characterized by comprising a polishing table having a polishing surface for polishing a semiconductor substrate; a light-emitting optical fiber which emits measurement light, for measuring a film of the semiconductor substrate, through an opening provided in the polishing surface to the semiconductor substrate; and a light-receiving optical fiber which receives the measurement light reflected from the semiconductor substrate, wherein an optical axis of the light-emitting optical fiber and an optical axis of the light-receiving optical fiber are inclined with respect to each other.

Strong light is emitted from the optical fiber along an optical axis, and intensity of this emitted light is lowered at a position spaced from the optical axis. With regard to sensitivity of an optical fiber, an optical fiber can receive light entering from a direction along an optical axis more sensitively as compared to light entering from peripheral portions away from the optical axis. According to the present invention, since an optical axis of the light-emitting optical fiber and an optical axis of the light-receiving optical fiber are inclined with respect to each other, it is possible to improve a light-receiving efficiency of reflected light received by the light-receiving optical fiber.

According to a preferred aspect of the present invention, the optical axis of the light-emitting optical fiber and the optical axis of the light-receiving optical fiber are symmetrical with respect to a normal line of the semiconductor substrate.

With an arrangement in which the optical axis of the light-emitting optical fiber and the optical axis of the light-receiving optical fiber are symmetrical with respect to a normal line of the semiconductor substrate, a traveling direction of light reflected from the substrate substantially coincides with the optical axis of the light-receiving optical fiber. Thus, it is possible to improve a light-receiving efficiency of measurement light received by the light-receiving optical fiber.

According to a preferred aspect of the present invention, the substrate polishing apparatus comprises a polishing table having a polishing surface for polishing a semiconductor substrate; a light-emitting optical fiber which emits measurement light, for measuring a film of the semiconductor substrate, through an opening provided in the polishing surface to the semiconductor substrate; a light-receiving optical fiber which receives the measurement light reflected from the semiconductor substrate; and light-emitting condensing structure provided at an emitting end of the light-emitting optical fiber for condensing measurement light emitted from the light-emitting optical fiber to the semiconductor substrate.

According to the present invention, measurement light can be condensed to the substrate by the light-emitting condensing structure, and a light-emitting range can be reduced. Accordingly, it is possible to reduce influence on film measurement of a pattern on a substrate. It is desirable that a range to which measurement light is emitted is reduced so that irregularities of the pattern on the substrate have no influence on the film measurement. The light-emitting condensing structure may be formed by attaching a lens to an emitting end or lens-processing an emitting end.

According to a preferred aspect of the present invention, the substrate polishing apparatus comprises a polishing table having a polishing surface for polishing a semiconductor substrate; a light-emitting optical fiber which emits measurement light, for measuring a film of the semiconductor substrate, through an opening provided in the polishing surface to the semiconductor substrate; a light-receiving optical fiber which receives the measurement light reflected from the semiconductor substrate; and light-receiving condensing structure provided at an incident end of the light-receiving optical fiber for condensing measurement light reflected from the semiconductor substrate to the light-receiving optical fiber.

With this arrangement, light reflected from the substrate can be focused and condensed at a predetermined point of the light-receiving optical fiber. Thus, noise components can be reduced to improve an S/N ratio of measurement light. The light-receiving condensing structure may be formed by attaching a lens to an incident end or lens-processing an incident end.

According to a preferred aspect of the present invention, the substrate polishing apparatus comprises a polishing table having a polishing surface for polishing a semiconductor substrate; a light-emitting optical fiber which emits measurement light, for measuring a film of the semiconductor substrate, through an opening provided in the polishing surface to the semiconductor substrate; a light-receiving optical fiber which receives the measurement light reflected from the semiconductor substrate; and light-emitting and light-receiving condensation structure for condensing measurement light emitted by the light-emitting optical fiber to the semiconductor substrate, and condensing measurement light reflected from the semiconductor substrate to the light-receiving optical fiber, with the light-emitting and light-receiving condensation structure being provided so as to cover an emitting end of the light-emitting optical fiber and an incident end of the light-receiving optical fiber.

According to the present invention, since one light-emitting and light-receiving condensation structure performs condensation of measurement light to the substrate and condensation of reflected light from the substrate, a focal point of measurement light emitted from the light-emitting optical fiber and a focal point of measurement light received by the light-receiving optical fiber coincide with each other. Accordingly, emitted measurement light can be condensed to the substrate, and light reflected from a condensed point can be condensed to the light-receiving optical fiber. Thus, it is possible to improve an S/N ratio of measurement light. The light-emitting and light-receiving condensation structure may be formed by attaching a lens covering the emitting end and the incident end to the emitting end and the incident end, or lens-processing the emitting end and the incident end.

According to a sixth aspect of the present invention, there is provided a substrate polishing apparatus characterized by comprising a polishing table having a polishing surface for polishing a semiconductor substrate; and an optical fiber member for emitting measurement light, for measuring a film of the semiconductor substrate, through an opening provided in the polishing surface to the semiconductor substrate and for receiving the measurement light reflected from the semiconductor substrate, wherein the optical fiber member includes at least one light-emitting optical fiber and at least one light-receiving optical fiber, with one of the at least one light-emitting optical fiber and the at least one light-receiving optical fiber being surrounded by the other of the at least one light-emitting optical fiber and the at least one light-receiving optical fiber.

With this arrangement, it is possible to increase a light-receiving ratio of measurement light reflected from the substrate and improve an S/N ratio of measurement light.

According to a preferred aspect of the present invention, one of the at least one light-emitting optical fiber and the at least one light-receiving optical fiber covers the other of the at least one light-emitting optical fiber and the at least one light-receiving optical fiber.

With an arrangement in which one of the light-emitting optical fiber and the light-receiving optical fiber covers the other of the light-emitting optical fiber and the light-receiving optical fiber, a clad common to both optical fibers can be formed between the light-emitting optical fiber and the light-receiving optical fiber. With a common clad, it is possible to reduce an interval between a core of the light-emitting optical fiber and a core of the light-receiving optical fiber. Thus, it is possible to increase a ratio of light received by the light-receiving optical fiber to light reflected from the substrate.

According to a preferred aspect of the present invention, the optical fiber member includes a light-emitting optical fiber and a plurality of light-receiving optical fibers which surrounds the light-emitting optical fiber.

Since measurement light is emitted from a light-emitting optical fiber, a range to which measurement light is applied can be restricted.

According to a preferred aspect of the present invention, the optical fiber member includes a light-receiving optical fiber and a plurality of light-emitting optical fibers which surrounds the light-receiving optical fiber.

According to the present invention, since the light-receiving optical fiber is surrounded by a plurality of light-emitting optical fibers, the light-receiving optical fiber can efficiently receive measurement light emitted from the light-emitting optical fibers.

According to a seventh aspect of the present invention, there is provided a substrate polishing apparatus characterized by comprising a polishing table having a polishing surface for polishing a semiconductor substrate; and an optical fiber member for emitting measurement light, for measuring a film of the semiconductor substrate, through an opening provided in the polishing surface to the semiconductor substrate and for receiving the measurement light reflected from the semiconductor substrate, wherein the optical fiber member includes a plurality of light-emitting optical fibers and a plurality of light-receiving optical fibers, with the light-emitting optical fibers and the light-receiving optical fibers being bundled together.

With this arrangement, it is possible to increase a light-receiving ratio of measurement light reflected from the substrate and improve an S/N ratio of measurement light.

According to a preferred aspect of the present invention, the optical fiber member is arranged such that a plurality of light-emitting optical fibers is surrounded by a plurality of light-receiving optical fibers.

By concentrating light-emitting optical fibers at a center of the optical fiber member, a range to which measurement light is applied can be restricted.

According to a preferred aspect of the present invention, the optical fiber member is arranged such that a plurality of light-receiving optical fibers is surrounded by a plurality of light-emitting optical fibers.

According to the present invention, since the light-receiving optical fibers are surrounded by the plurality of light-emitting optical fibers, the light-receiving optical fibers can efficiently receive measurement light emitted from the light-emitting optical fibers.

According to an eighth aspect of the present invention, there is provided a substrate polishing apparatus characterized by comprising a polishing table having a polishing surface for polishing a semiconductor substrate; and an optical fiber member for emitting measurement light, for measuring a film of the semiconductor substrate, through an opening provided in the polishing surface to the semiconductor substrate and for receiving the measurement light reflected from the semiconductor substrate, wherein the optical fiber member comprises a composite optical fiber having divided cross-sections including a region of a light-emitting optical fiber and a region of a light-receiving optical fiber.

With an arrangement having a region of a light-emitting optical fiber and a region of a light-receiving optical fiber, a clad common to both optical fibers can be formed between these respective regions. With a common clad, it is possible to reduce intervals between a core of the light-emitting optical fiber region and a core of the light-receiving optical fiber region. Thus, it is possible to enlarge an overlapping area of an application area of measurement light emitted from the light-emitting optical fiber region and a light-receivable area of measurement light received by the light-receiving optical fiber region.

Although various aspects of the present invention have been described above, the present invention is not limited to the above substrate polishing apparatus. For example, according to another aspect of the present invention, there is provided a substrate measuring device provided in the above substrate polishing apparatus. Further, according to another aspect of the present invention, there is provided a substrate polishing method employing the above substrate polishing apparatus and a substrate measuring method employing the substrate measuring device.

The above and other objects, features, and advantages of the present invention will be apparent from the following description when taken in conjunction with the accompanying drawings which illustrate preferred embodiments of the present invention by way of example.

BRIEF DESCRIPTION OF DRAWINGS

FIG. 2 is a diagram showing an example of an arrangement of a sensor provided in the substrate polishing apparatus shown in FIG. 1;

FIG. 11 is a diagram showing an arrangement of a substrate polishing apparatus according to a second embodiment of the present invention;

FIG. 20 is a cross-sectional view of a light-emitting optical fiber and a light-receiving optical fiber according to a fifth embodiment of the present invention;

FIG. 25 is a cross-sectional view of light-emitting optical fibers and light-receiving optical fibers which are used in a seventh embodiment of the present invention;

DETAILED DESCRIPTION OF THE PREFERRED EMBODIMENTS

A substrate polishing apparatus according to embodiments of the present invention will be described below with reference to FIGS. 1 through 31.

Figure 1:
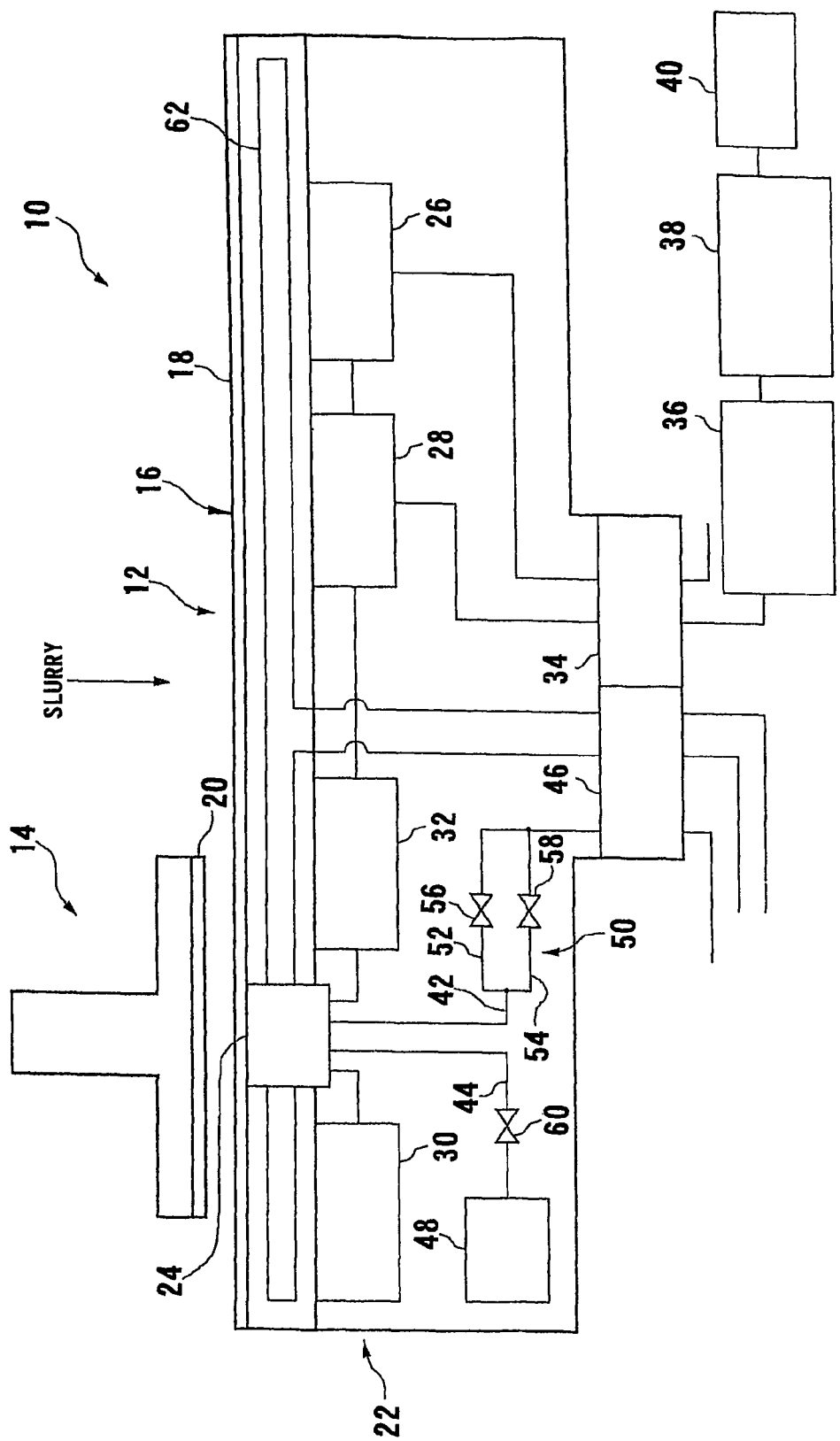
FIG. 1 is a diagram showing a substrate polishing apparatus according to a first embodiment of the present invention.

FIG. 1 shows a substrate polishing apparatus 10 according to a first embodiment of the present invention. The substrate polishing apparatus 10 comprises a chemical mechanical polishing (CMP) apparatus. The substrate polishing apparatus 10 has a polishing table 12 and a top ring 14. A polishing pad 18, which has a polishing surface 16 thereon, is mounted on the polishing table 12. The top ring 14 supports a substrate 20 on a lower surface thereof and is rotated together with the substrate 20. The top ring 14 presses the substrate 20 against the polishing pad 18 at a location away from a center of the polishing table 12. Slurry for polishing is supplied between the polishing pad 18 and the substrate 20. The substrate 20 is rotated in presence of the slurry in a state such that the substrate 20 is pressed against the polishing pad 18 on the polishing table 12. Further, the polishing table 12 is rotated. The substrate 20 is thus polished. The polishing pad 18 may comprise a polishing cloth made of polyurethane foam, a non-woven fabric type polishing cloth, a suede type polishing cloth, or a fixed abrasive type polishing pad, which is formed by fixing polishing abrasive particles by a binder agent such as epoxy.

The substrate polishing apparatus 10 is used to polish a thin film formed on the substrate 20. Polishing is completed when a thickness of the thin film becomes a predetermined value. In the present embodiment, determination of completion is referred to as end point detection. The substrate polishing apparatus 10 has a film thickness measuring device 22, which will be described below, for end point detection.

The film thickness measuring device 22 will be described as an example of a substrate measuring device according to the present invention. For example, a film to be measured is a silicon oxide film. The film thickness measuring device 22 has a sensor 24 mounted in the polishing table (rotatable table) 12, a power supply unit 26, a controller unit 28, a light source unit 30, and a photometer unit 32. The power supply unit 26, the controller unit 28, the light source unit 30, and the photometer unit 32 are mounted on a lower surface of the polishing table 12.

The power supply unit 26 receives electric power via a rotary connector 34 and supplies the electric power to respective units in the film thickness measuring device 22. The controller unit 28 controls an entire system of the film thickness measuring device 22. The light source unit 30 supplies measurement light to the sensor 24, and the measurement light is applied to the substrate 20 through the sensor 24. The sensor 24 receives reflected light from the substrate 20 and transmits it to the photometer unit 32. The measurement light and the reflected light are transmitted through optical fibers. In the photometer unit 32, light signals are converted into electric signals. The electric signals are processed in the controller unit 28.

The controller unit 28 is connected to a calculation unit 36 for optical characteristics via the rotary connector 34. The calculation unit 36 is connected to a determination unit 38 for optical characteristics. Signals processed in the controller unit 28 are transmitted to the calculation unit 36, which calculates optical characteristics such as a film thickness of the substrate, reflection intensity, and a spectrum. The determination unit 38 determines the optical characteristics such as the film thickness of the substrate and performs end point detection to determine whether or not the film thickness of the substrate reaches a predetermined value. Determined results are sent to a polishing control unit 40, which controls an entire system of the substrate polishing apparatus 10.

The film thickness measuring device 22 also has a supply passage 42 to supply a measurement fluid to the sensor 24, and a discharge passage 44 to discharge the measurement fluid from the sensor 24. The supply passage 42 is connected to a tank (not shown) via a rotary joint 46. The discharge passage 44 is connected to a pump 48 for discharging a fluid in a measurement chamber (fluid chamber). The measurement fluid is discharged by the pump 48, and a polishing liquid such as slurry flowing into the measurement chamber is also discharged together with the measurement fluid.

In the present embodiment, pure water is used as the measurement fluid. The pure water may be supplied from a tank provided in a facility such as a plant having a substrate polishing apparatus. The supply passage 42 and the discharge passage 44 are formed by suitable pipes or the like. For example, by coating the pipes with resin (non-metal material) such as polyether ether ketone (PEEK), it is possible to prevent metal contamination of a substrate. The supply passage 42 and the discharge passage 44 may include jackets provided in the polishing table 12.

As shown in FIG. 1, the supply passage 42 has a parallel section 50, and the parallel section 50 comprises a main passage 52 and a sub passage 54. The main passage 52 and the sub passage 54 have supply control valves 56 and 58, respectively. The main passage 52 is used to supply pure water at a high flow rate and eject the pure water through the sensor 24. The sub passage 54 has an orifice (not shown) and is used to supply pure water at a low flow rate. The supply control valves 56 and 58 are opened and closed to switch low-flow-rate supply of pure water and ejection of pure water.

Further, the discharge passage 44 has a discharge control valve 60. The discharge control valve 60 is used to control timing of compulsory discharge of the pure water. Each of the discharge control valve 60 and the supply control valves 56 and 58 comprises an electromagnetic valve having an electromagnetic valve unit (not shown). The electromagnetic valve unit is mounted on a lower surface of the polishing table 12 as with other units.

The substrate polishing apparatus 10 also has a water jacket 62 provided in the polishing table 12 for cooling the polishing table 12. The water jacket 62 is connected to a water tank (not shown) through the rotary joint 46.

FIG. 2 shows an example of an arrangement of the sensor 24. As described above, the polishing pad 18 is mounted on the polishing table 12, and the substrate 20 is brought into contact with the polishing pad 18. The supply passage 42 and the discharge passage 44 are provided adjacent each other in the polishing table 12. A supply port 64 of the supply passage 42 and a discharge port 66 of the discharge passage 44 are positioned on an upper surface of the polishing table 12. The polishing pad 18 has a through-hole 68 so as to expose the supply port 64 and the discharge port 66 to the substrate 20.

A light-emitting optical fiber 70 and a light-receiving optical fiber 72 are disposed adjacent each other within the supply passage 42. The light-emitting optical fiber 70 and the light-receiving optical fiber 72 are connected to the light source unit 30 and the photometer unit 32 (FIG. 1), respectively. The light-emitting optical fiber 70 applies measurement light, which is supplied from the light source unit 30, to the substrate 20. The light-receiving optical fiber 72 receives reflected light from the substrate 20 and transmits it to the photometer unit 32.

In the sensor 24 described above, a measurement fluid such as pure water is supplied through the supply port 64 and discharged through the discharge port 66. An interior of the through-hole 68 is filled with pure water or the like, so that slurry used for polishing is prevented from entering the through-hole 68. Thus, since the interior of the through-hole 68 is maintained transparent, film measurement using measurement light can satisfactorily be performed.

Figure 3:
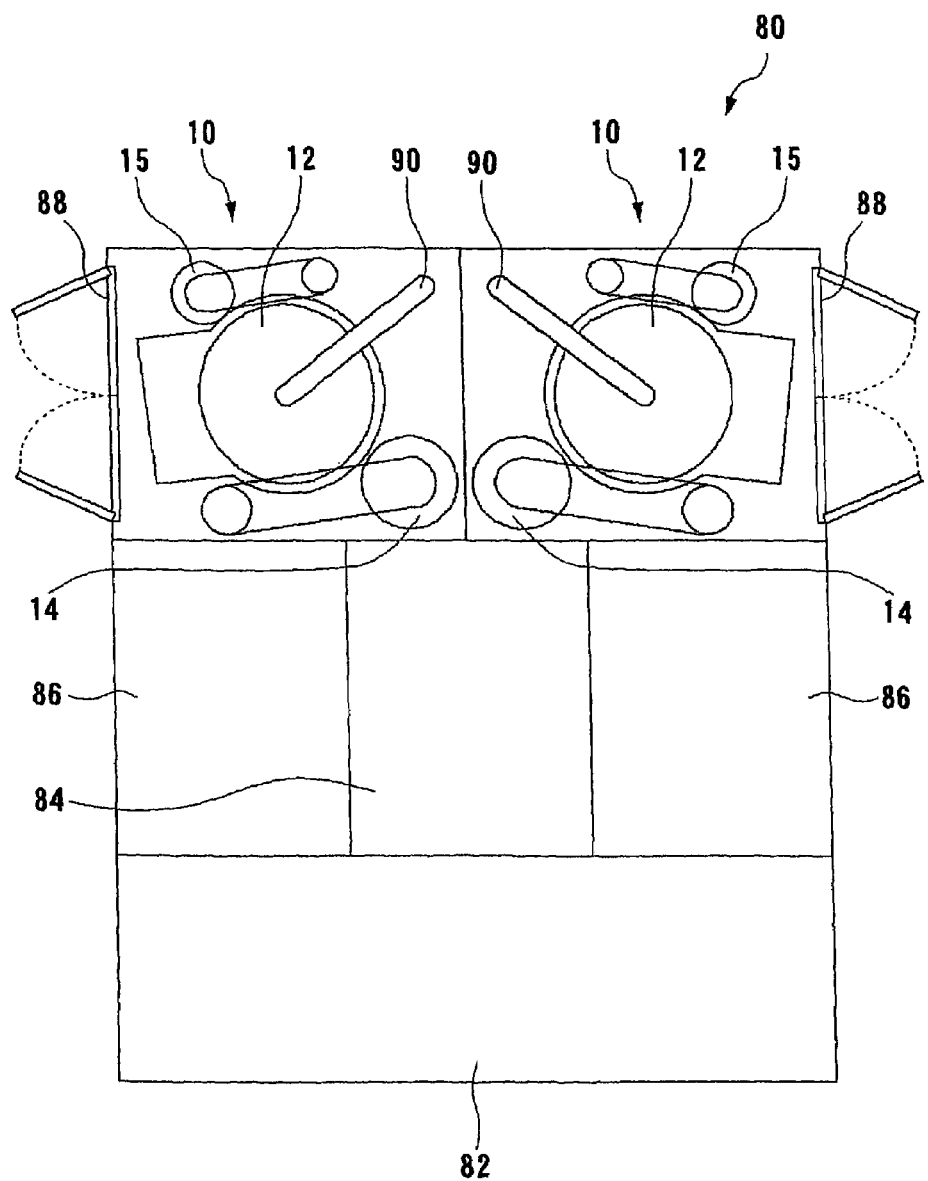
FIG. 3 is a diagram showing a substrate processing apparatus having the substrate polishing apparatus shown in FIG. 1.

FIG. 3 shows an entire arrangement of a substrate processing apparatus 80 having the substrate polishing apparatuses 10. The substrate processing apparatus 80 has a substrate cassette holding section 82, a substrate moving device 84, two cleaning chambers 86, and two substrate polishing apparatuses 10. A substrate as a workpiece to be polished is delivered from the substrate cassette holding section 82 to the substrate polishing apparatus 10. A polished substrate is cleaned and dried in the cleaning chamber 86 and returned to the substrate cassette holding section 82.

Further, the substrate processing apparatus 80 has working windows 88 attached to chambers in which the substrate polishing apparatuses 10 are installed. Each of the substrate polishing apparatuses 10 has a top ring 14 for supporting a substrate, a dresser 15 provided so as to face the top ring 14, a polishing table 12 interposed between the dresser 15 and the top ring 14, and a nozzle 90 for supplying slurry to the polishing table 12. The nozzle 90 forms a slurry supply pipe, i.e. a slurry supply device, for supplying slurry from a slurry container (not shown). A measurement fluid is supplied to the polishing table 12 from a lower portion of the nozzle (not shown).

An entire arrangement of the substrate polishing apparatus 10 in the present embodiment has been described together with the arrangement of the sensor 24. Next, there will be described features of the arrangement in the present embodiment.

Figure 4:
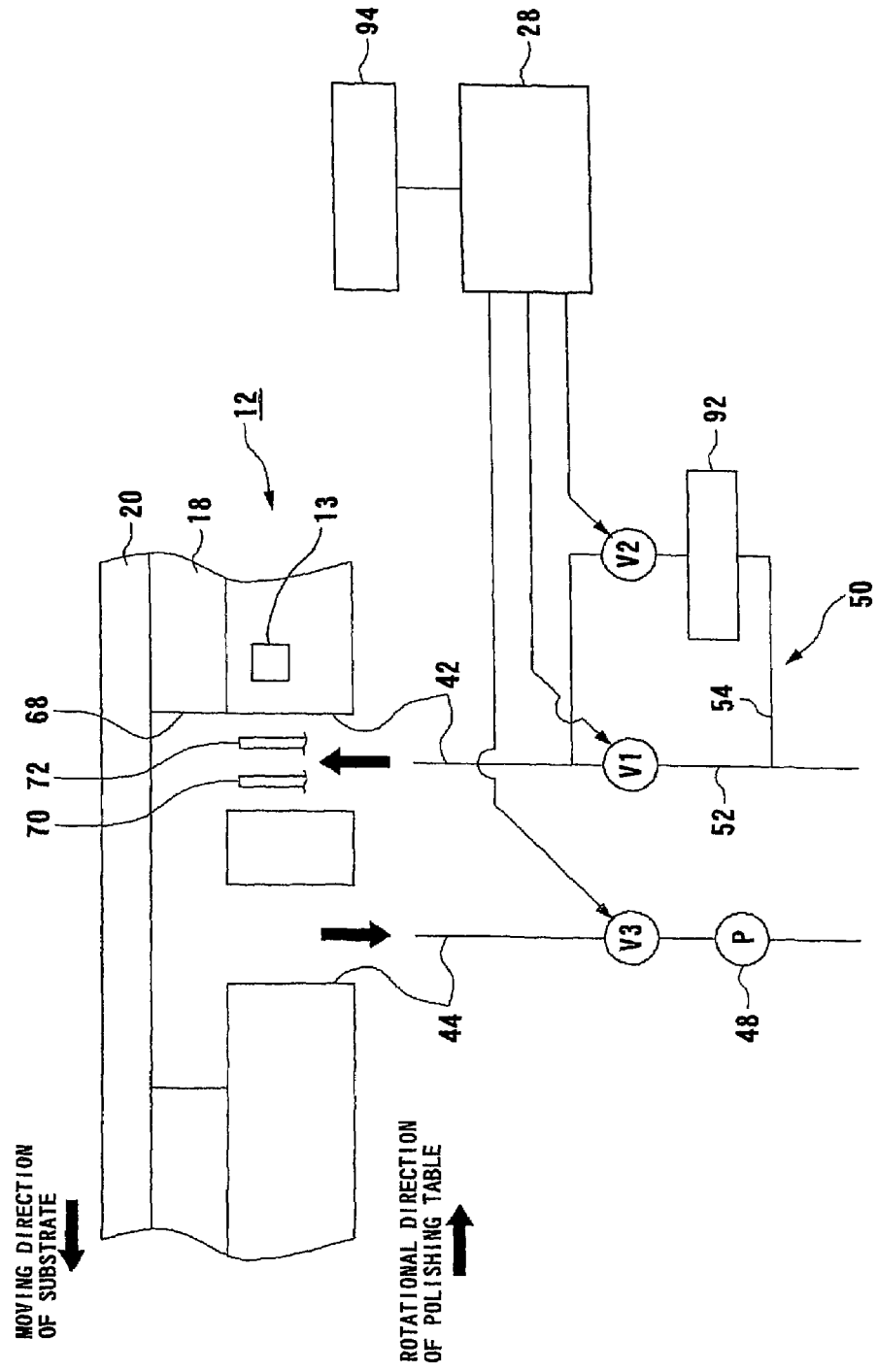
FIG. 4 is a diagram showing an arrangement for control of supply and discharge of a measurement fluid in the substrate polishing apparatus shown in FIG. 1.

FIG. 4 shows an arrangement with respect to control of supply and discharge of a measurement fluid such as pure water. As described above, the through-hole 68 is formed in the polishing pad 18, and the supply passage 42 and the discharge passage 44 communicate with the through-hole 68. The light-emitting optical fiber 70 and the light-receiving optical fiber 72 are disposed within the supply passage 42.

The supply passage 42 has the parallel section 50, and the parallel section 50 comprises the main passage 52 and the sub passage 54. The sub passage 54 has an orifice 92 to restrict the sub passage 54. The main passage 52 has an ejection control valve V1, and the sub passage 54 has a low-flow-rate control valve V2. The ejection control valve V1 and the low-flow-rate control valve V2 correspond to the supply control valves 56 and 58 shown in FIG. 1 and form a switching device for the main passage 52 and the sub passage 54.

Pure water delivered from a pipe in a facility having the substrate polishing apparatus 10 is introduced into the supply passage 42. An amount of pure water supplied from the supply passage 42 to the through-hole 68 is set as follows. Specifically, the supply passage 42 is arranged such that a flow rate of pure water is in a range of 50 to 200 cc/min at a time when the ejection control valve V1 of the main passage 52 is opened and the low-flow-rate control valve V2 of the sub passage 54 is closed, and that the flow rate of pure water is at most 50 cc/min at a time when the low-flow-rate control valve V2 is opened and the ejection control valve V1 is closed. With such an arrangement, pure water is ejected through the main passage 52 to the through-hole 68 and supplied at a low flow rate through the sub passage 54 to the through-hole 68.

A pump 48 is disposed in the discharge passage 44, and a discharge control valve V3 is also disposed in the discharge passage 44. The discharge control valve V3 corresponds to the discharge control valve 60 shown in FIG. 1. The pump 48 comprises a constant amount pump in the present embodiment. An amount of discharged pure water is set to be in a range of +20% of an amount of ejected pure water. Preferably, an amount of supplied pure water is set to be larger than the amount of discharged pure water to maintain a sufficient amount of water during measurement. The pump 48 is not limited to a constant amount pump within the scope of the present invention, and a constant pressure pump may be used as the pump 48.

The amount of pure water discharged through the discharge passage 44 may be controlled by opening and closing of the discharge control valve V3 or operation and interruption of the pump 48. The pump 48 may comprise a diaphragm pump having a diaphragm operated by piezoelectric elements. It is desirable that a portion of the pump 48 which contacts pure water and/or portions of the control valves V1, V2, and V3 which contact pure water be made of a nonmetal material. Further, the control valves V1, V2, and V3 should preferably comprise a solenoid valve.

Opening and closing of the ejection control valve V1, the low-flow-rate control valve V2, and the discharge control valve V3 are controlled by the controller unit 28. A rotational angle sensor 94 is connected to the controller unit 28. The rotational angle sensor 94 detects an angular position of the polishing table 12 in a rotational direction. The controller unit 28 controls opening and closing of the ejection control valve V1, the low-flow-rate control valve V2, and the discharge control valve V3 based on detected signals of the rotational angle sensor 94.

The position of the substrate 20 is fixed relative to the polishing table 12. The through-hole 68 is rotated together with the polishing table 12. Use of the angular position of the polishing table 12 allows the controller unit 28 to control the ejection control valve V1, the low-flow-rate control valve V2, and the discharge control valve V3 according to a positional relationship between the through-hole 68 and the substrate 20. The rotational angle sensor 94 serves as a sensor or device for detecting a rotational angle of the polishing table 12 so as to detect the positional relationship between the through-hole 68 and the substrate 20.

With the above arrangement, the through-hole 68 corresponds to a fluid chamber according to the present invention. The light-emitting optical fiber 70 and the light-receiving optical fiber 72 form a light-emitting and light-receiving device for emitting and receiving measurement light. The supply passage 42 and the discharge passage 44 serve as a supply device and a discharge device for a measurement fluid such as pure water. The ejection control valve V1 and the low-flow-rate control valve V2 form a fluid supply control device together with the controller unit 28. Similarly, the discharge control valve V3 forms a fluid discharge control device together with the controller unit 28. Furthermore, the main passage 52 and the sub passage 54 in the supply passage 42 correspond to a passage for ejection and a passage for low-flow-rate supply.

Next, control of supply and discharge by the controller unit 28 will be described with reference to FIGS. 5 through 9.

Figure 5:
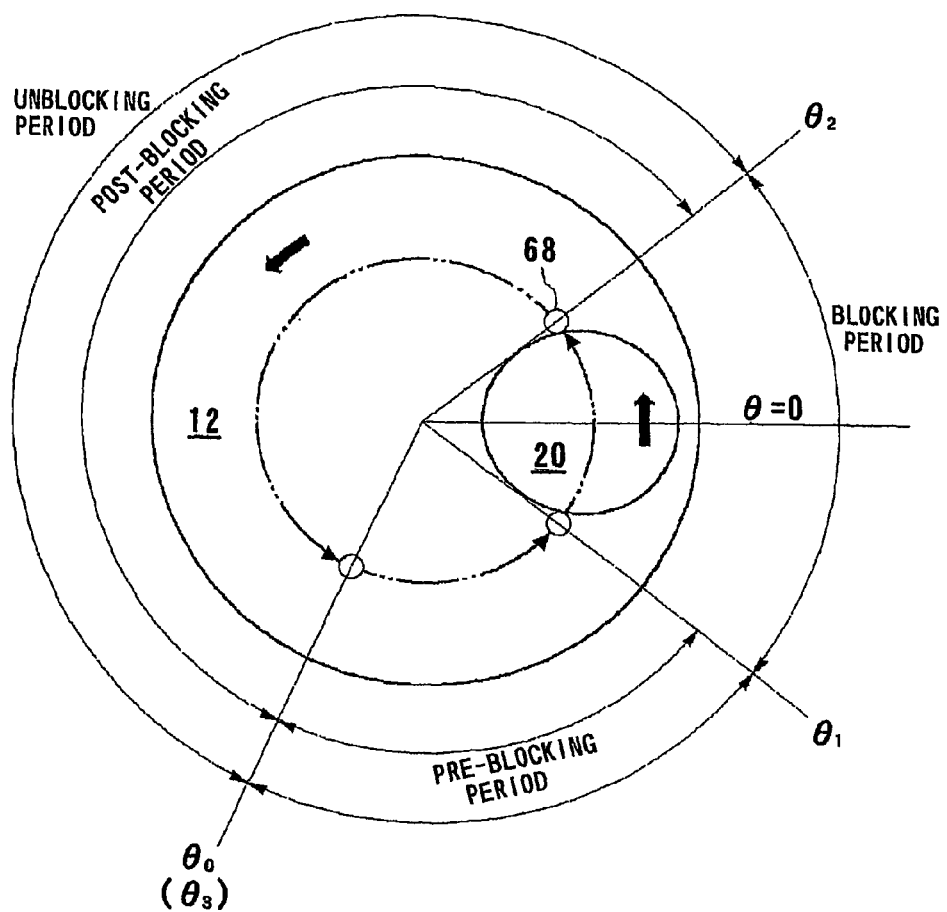
FIG. 5 is a diagram showing a positional relationship between a substrate and a through-hole of a polishing table in the substrate polishing apparatus shown in FIG. 1.

FIG. 5 shows the positional relationship between the through-hole 68 (fluid chamber) and the substrate 20. As described above, the position of the substrate 20 is fixed relative to the polishing table 12, and the through-hole 68 is rotated together with the polishing table 12. Therefore, the positional relationship between the through-hole 68 and the substrate 20 is represented by an angular position θ of the through-hole 68 in a rotational direction. In FIG. 5, when the through-hole 68 is positioned on a line interconnecting a center of the polishing table 12 and a center of the substrate 20, the angular position θ of the through-hole 68 is defined as zero degrees.

In FIG. 5, when θ=θ1, an end of the through-hole 68 reaches the substrate 20, and the through-hole 68 begins to be covered with the substrate 20. When θ=θ2, the through-hole 68 has completely passed across the substrate 20, and the through-hole 68 becomes entirely uncovered by the substrate 20. Therefore, during a period of θ1≦θ≦θ2, the substrate 20 is positioned above the through-hole 68. This period is referred to as a "blocking period" in the present embodiment. During any period other than the blocking period, the through-hole 68 is not blocked by the substrate 20, and this period is referred to as an "unblocking period" as shown in FIG. 5. The "unblocking period" is classified into two periods including a "pre-blocking period" and a "post-blocking period".

The pre-blocking period is defined as a predetermined period before the through-hole 68 is blocked by the substrate 20. In the present embodiment, the pre-blocking period is set as θ0≦θ<θ1. θ0 is set so as to be −120 degrees. The post-blocking period is defined as a predetermined period after blocking of the through-hole 68 by the substrate 20 is completed. In FIG. 5, the post-blocking period is defined as θ2<θ<θ3. θ3 is 240 degrees (=360+θ0), and hence a subsequent pre-blocking period starts after the post-blocking period has ended.

More specifically, the blocking period may be set as follows.

Figure 6:
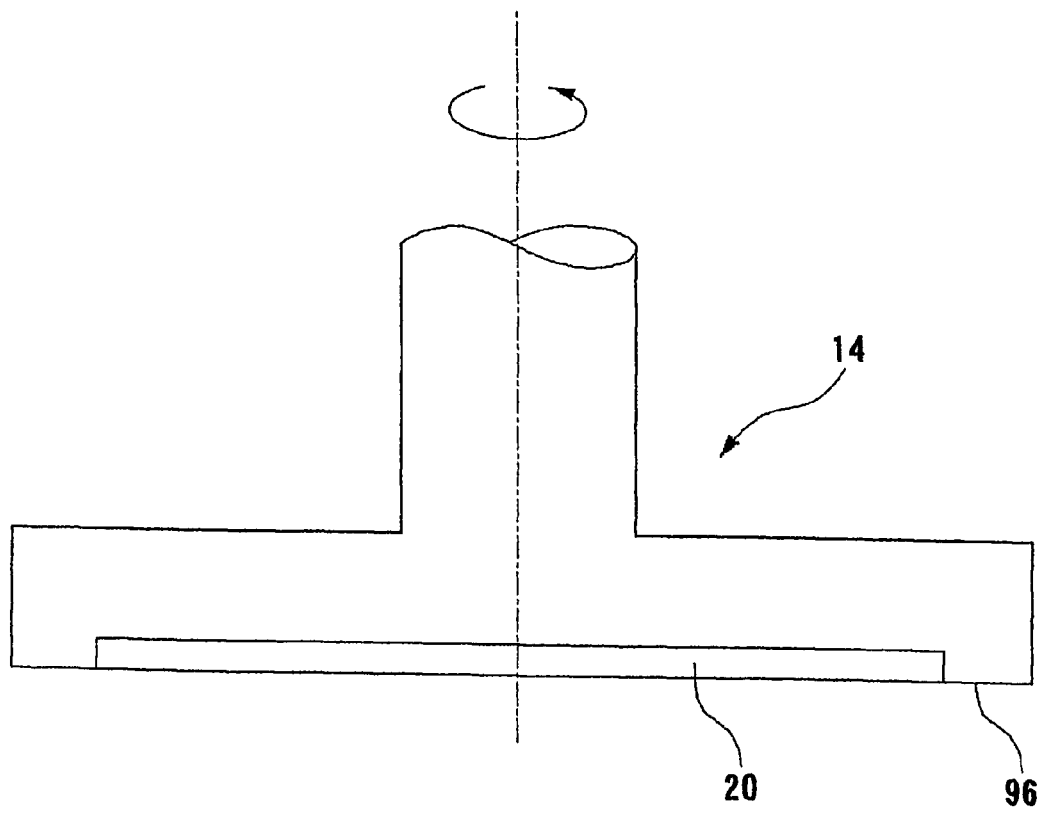
FIG. 6 is a diagram showing an arrangement of a top ring for supporting a substrate.

FIG. 6 shows an arrangement of the top ring 14 for supporting the substrate 20. As shown in FIG. 6, the top ring 14 generally has a guide ring 96 on a supporting surface on which the substrate 20 is mounted. A peripheral portion of the substrate 20 is surrounded by the guide ring 96. In such a case, the "blocking period" may be set as a period during which the through-hole reaches the guide ring 96 and passes across the substrate 20 and away from the guide ring 96 at an opposite side of the substrate 20. According to this setting, the guide ring 96 is regarded as a portion of the substrate 20, and this configuration is also included in the scope of the present invention. In other words, the blocking period according to the present invention may be a period from a time when the through-hole reaches the guide ring 96 to a time when the through-hole passes away from the guide ring 96, i.e. a period during which the fluid chamber is blocked by the substrate. This holds true in cases where elements other than the guide ring 96 are disposed around the substrate 20. The blocking period may be set based on overlap of only the substrate 20 with the through-hole without consideration of elements such as the guide ring 96.

Figure 7:
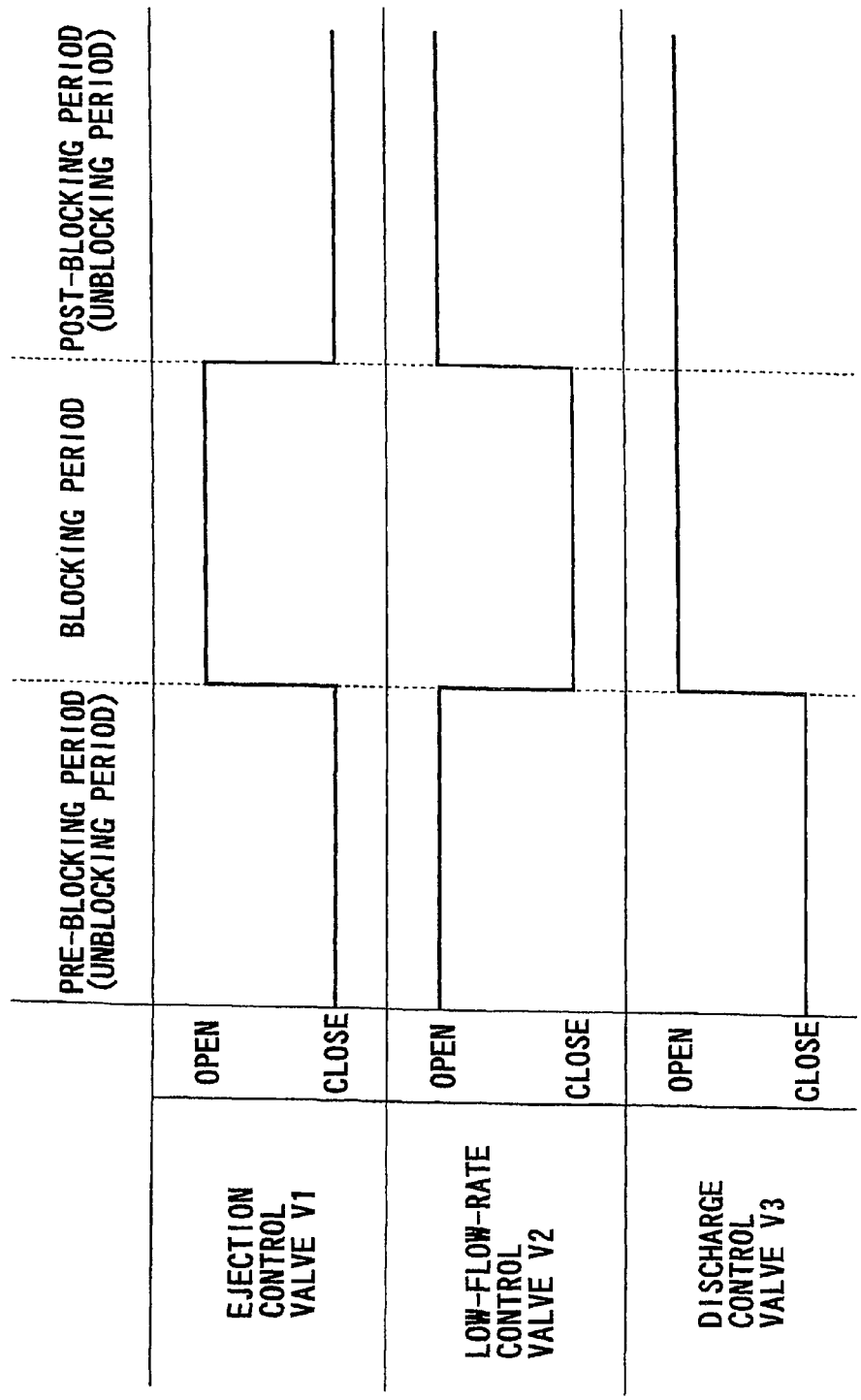
FIG. 7 is a time chart showing control of supply and discharge of the measurement fluid in the arrangement shown in FIG. 4.

FIG. 7 shows opening and closing control of the ejection control valve V1, the low-flow-rate control valve V2, and the discharge control valve V3 during respective periods shown in FIG. 5.

During the pre-blocking period, the controller unit 28 sets a low-flow-rate mode. In the low-flow-rate mode, the ejection control valve V1 is closed, and the low-flow-rate control valve V2 is opened in response to a control signal from the controller unit 28. Thus, pure water is supplied through the sub passage 54 at a low flow rate.

Further, during the pre-blocking period, the controller unit 28 controls the discharge control valve V3 to restrict compulsory discharge. In the present embodiment, since the discharge control valve V3 is closed, the compulsory discharge is stopped.

Next, during the blocking period, the controller unit 28 sets an ejection mode. In the ejection mode, the ejection control valve V1 is opened, and the low-flow-rate control valve V2 is closed in response to a control signal from the controller unit 28. Thus, a large amount of pure water is supplied through the main passage 52, and this supplied pure water is ejected into the through-hole 68. Within the scope of the present invention, the low-flow-rate control valve V2 may not be closed. Also in this case, it is possible to switch low-flow-rate supply and ejection of pure water (hereinafter the same as above).

Further, during the blocking period, the controller unit 28 controls the discharge control valve V3 so as to perform compulsory discharge. The discharge control valve V3 is opened in response to a control signal from the controller unit 28 to perform compulsory discharge by the pump 48.

Next, during the post-blocking period, the controller unit 28 switches from the ejection mode to the low-flow-rate mode. Therefore, the ejection control valve V1 is closed, and the low-flow-rate control valve V2 is opened to reduce an amount of supplied pure water.

Further, during the post-blocking period, the controller unit 28 continues the compulsory discharge performed during the blocking period. Therefore, the discharge control valve V3 remains opened, and compulsory discharge is performed by the pump 48.

Figure 8:
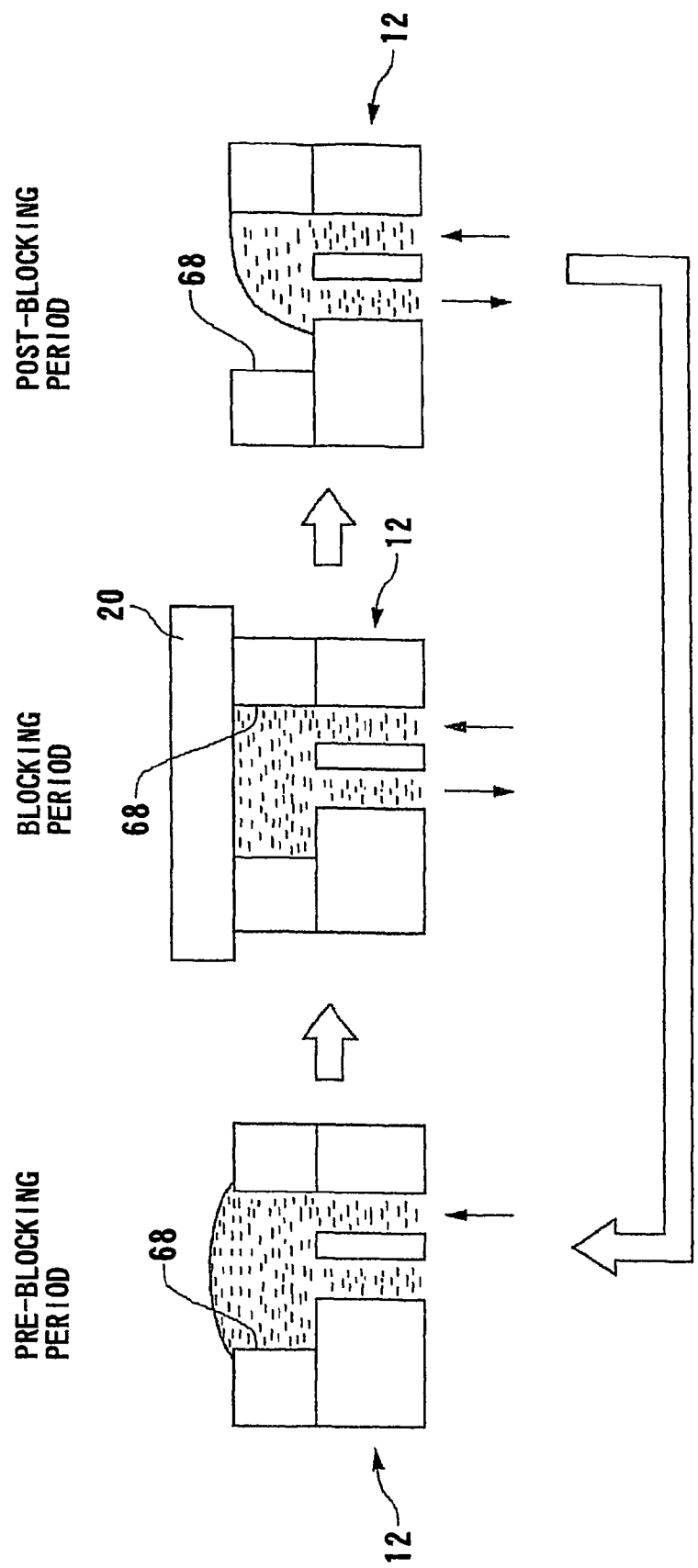
FIG. 8 is a diagram showing changes of an amount of fluid in a through-hole of a polishing table under the control shown in FIG. 7.

FIG. 8 is a schematic view showing a state of the through-hole 68 during respective periods described above. First, the blocking period shown at a center of FIG. 8 will be described. Since pure water is ejected during the blocking period, the through-hole 68 is filled with a large amount of pure water. Slurry in the through-hole 68 is diluted by the pure water. Particularly, pure water immediately after being supplied forms substantially a vertical liquid column above the supply passage 42 to maintain transparency required for measurement. Film thickness measurement is performed during the blocking period. Specifically, measurement light is emitted and reflected light is received within a water column produced by ejection. During the blocking period, the through-hole 68 is blocked by the substrate 20, and the compulsory discharge is performed. Therefore, an amount of pure water flowing out between the substrate 20 and the surface of the polishing pad 18 can be reduced.

Thus, during the blocking period, while outflow of the pure water is prevented, transparency can be maintained in the through-hole 68 to achieve a required measurement capability.

Next, during the post-blocking period, pure water is supplied to the through-hole 68 at a low flow rate, and the pure water is compulsorily discharged from the through-hole 68. Therefore, the pure water remains on a portion of the through-hole 68 as schematically shown in FIG. 8. With such a control, dilution of slurry due to ejection of pure water is prevented, and the slurry is prevented from entering the through-hole 68. Accordingly, slurry is prevented from attaching to surfaces of fibers for measurement, particularly to ends of the fibers.

In this regard, since measurement is not performed during the post-blocking period, it can be considered that supply of the pure water to the through-hole 68 is completely stopped. However, if slurry excessively enters the through-hole 68, then slurry may remain in the through-hole 68 at a next blocking period to lower transparency. In order to prevent such a drawback, pure water is supplied at a low flow rate during the post-blocking period in the present embodiment to suitably prevent slurry from entering the through-hole 68.

Next, the pre-blocking period will be described. During the pre-blocking period, supply of pure water at a low flow rate is continued, and the compulsory discharge is stopped. Thus, an amount of pure water within the through-hole 68 is increased. Since an amount of supplied pure water is small, an amount of pure water flowing out of the through-hole 68 can be reduced.

As described above, the amount of pure water within the through-hole 68 is increased during the pre-blocking period to substantially fill the fluid chamber with the pure water. Preferably, a length of the pre-blocking period is set so that the through-hole 68 is filled with pure water during the pre-blocking period as shown in FIG. 8. With this configuration, following advantages can be obtained.

Slurry pools are present immediately before the through-hole 68 on the polishing table 12 is moved below the substrate 20. The slurry pools are produced by the fact that slurry to be involved below the substrate 20 accumulates at a periphery of the substrate 20. More specifically, with an arrangement in which the substrate 20 is surrounded by the guide ring 96 (see FIG. 6) of the top ring 14, slurry pools are produced at a periphery of the guide ring 96. When the compulsory discharge is performed, the through-hole 68 reaches slurry pools in a state such that the through-hole 68 has voids therein. As a result, a large amount of slurry may flow into the through-hole 68 to lower measuring performance. However, in the present embodiment, with the aforementioned control, the amount of pure water within the through-hole 68 can be increased before the through-hole 68 reaches slurry pools.

Therefore, an amount of slurry flowing into the through-hole 68 when the through-hole 68 passes through the slurry pools can be reduced. This reduction of the amount of the slurry flowing into the through-hole 68 improves measuring performance when the through-hole 68 passes across the substrate 20.

Sizes of the slurry pools differ according to specifications of the slurry, the polishing pad, and the like. The slurry pools may not be produced in some cases. In such a case, according to the present embodiment, before the through-hole 68 has been blocked by the substrate 20, the amount of pure water is increased in the through-hole 68 to improve measuring performance. For example, it is possible to reduce bubbles involved when the through-hole 68 moves below the substrate 20.

Next, there will be described control after completion of a polishing process. After completion of the polishing process, the controller unit 28 sets a low-flow-rate mode and stops compulsory discharge. The ejection control valve V1 is closed, the low-flow-rate control valve V2 is opened, and the discharge control valve V3 is closed. Specifically, control similar to control during the pre-blocking period is performed. This control should suitably be performed after polishing of a substrate is completed and before polishing of a subsequent substrate is started. With such a control, it is possible to prevent pure water from flowing out of the through-hole 68 after completion of the polishing process (when a substrate is replaced) and to prevent slurry from entering the through-hole 68.

A sequence of the above control process is performed, and pure water is ejected to the through-hole 68 each time the polishing table makes one revolution. However, within the scope of the present invention, pure water may be ejected once per several revolutions. Specifically, pure water may be ejected once per N revolutions (N≧2).

In this case, low-flow-rate supply and compulsory discharge may be performed during all periods (including the pre-blocking period, the blocking period, and the post-blocking period) in any one of revolutions during which pure water is not ejected, as with the post-blocking period. A control shown in FIG. 7 is performed from the pre-blocking period right before the blocking period, during which pure water is ejected, until a next post-blocking period.

The above control is suitably used in a case where substrate measurement is conducted once per a plurality of revolutions. Ejection may be conducted in a revolution during which measurement is conducted. Thus, frequency of ejection can be reduced, and an amount of outflow of pure water is also reduced.

In the above embodiment, the blocking period determines a switching timing of flow-rate control. For setting a flow-rate control, a starting point of the blocking period is not required to coincide precisely with a point at which a substrate 20 begins to overlap the through-hole 68. For example, the blocking period may start when the through-hole (fluid chamber) 68 approaches an edge of the substrate within about 10 mm before the substrate 20 is positioned above the through-hole 68.

In this case, as shown in FIG. 4, a sensor 13 may be provided for detecting when the substrate 20 approaches the through-hole 68 to determine a starting point of the blocking period. The sensor 13 sends a signal to the controller unit 28, where a starting point of the blocking period is determined. This sensor may comprise a proximity sensor for detecting approach of metal, an optical sensor, or an eddy-current sensor. Further, both of an optical sensor and an eddy-current sensor may be provided in the polishing table 12 to perform measurement simultaneously or alternately. In FIG. 4, the sensor 13 is provided in the polishing table 12 which is rotated. However, such a sensor may be provided near the substrate 20 to detect a particular point of the polishing table 12 which is rotated.

Further, an amount of pure water supplied through the supply passage 42 may be increased so as to perform ejection of pure water during a latter half of the blocking period. In this case, transparency required for measurement can be maintained, and excessive dilution of slurry due to the ejection of pure water is prevented.

Similarly, an ending point of the blocking period is not required to coincide precisely with a point at which a substrate 20 finishes overlapping the through-hole 68. Period setting in consideration of the guide ring 96 shown in FIG. 6 can be considered as a setting example in which the blocking period does not coincide precisely with a period during which a substrate overlaps a through-hole. Further, switching points of the ejection control valve V1, the low-flow-rate control valve V2, and the discharge control valve V3 may not be precisely the same point.

Figure 9:
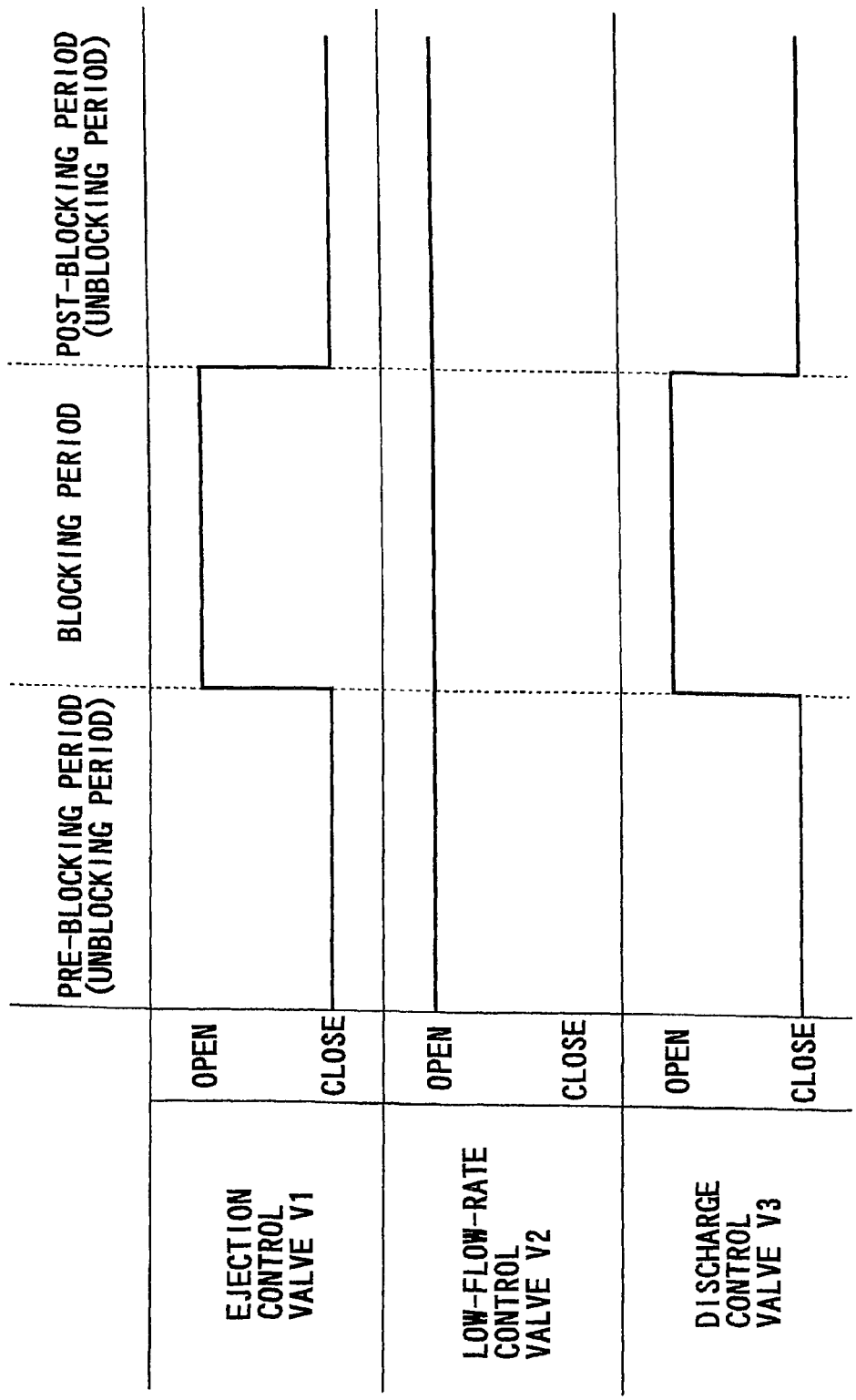
FIG. 9 is a time chart showing another control of supply and discharge of the measurement fluid in the arrangement shown in FIG. 4.

As described above, according to a variation of the above control, when a measurement fluid is ejected in an ejection mode, the low-flow-rate control valve V2 may not be closed. Specifically, the low-flow-rate control valve V2 may be opened at a time of ejection as well as at a time of low-flow-rate supply. For example, as shown in FIG. 9, only the low-flow-rate control valve V2 may be opened during the unblocking period, whereas the ejection control valve V1, the low-flow-rate control valve V2, and the discharge control valve V3 may be opened during the blocking period. In these controls, it is also possible to switch low-flow-rate supply and ejection. From this point of view, the low-flow-rate control valve V2 may be eliminated.

In the present embodiment, the parallel section 50 including the main passage 52 and the sub passage 54 is used as a fluid supply system to supply fluid to the fluid chamber. However, the supply passage 42 may be arranged so as to have a flow-rate control valve capable of variably setting a flow rate of the fluid at a desired value and supplying the fluid.

The polishing pad 18 is periodically replaced with a new polishing pad. At a time of replacement of the polishing pad 18, an adhesive surface of the polishing table 12 should be maintained in a clean and dry state. Therefore, supply of pure water through the supply passage 42 may temporarily be stopped for a short term. During other periods, pure water should preferably be supplied through the supply passage 42 to prevent an emitting end of the optical fiber 70 and an incident end of the optical fiber 72 from being dried. Generally, the through-hole (fluid chamber) 68 and the supply passage 42 are filled with pure water. Thus, even if supply of pure water through the supply passage 42 is temporarily stopped for a short term, the optical fibers 70 and 72 are not dried.

Figure 10:
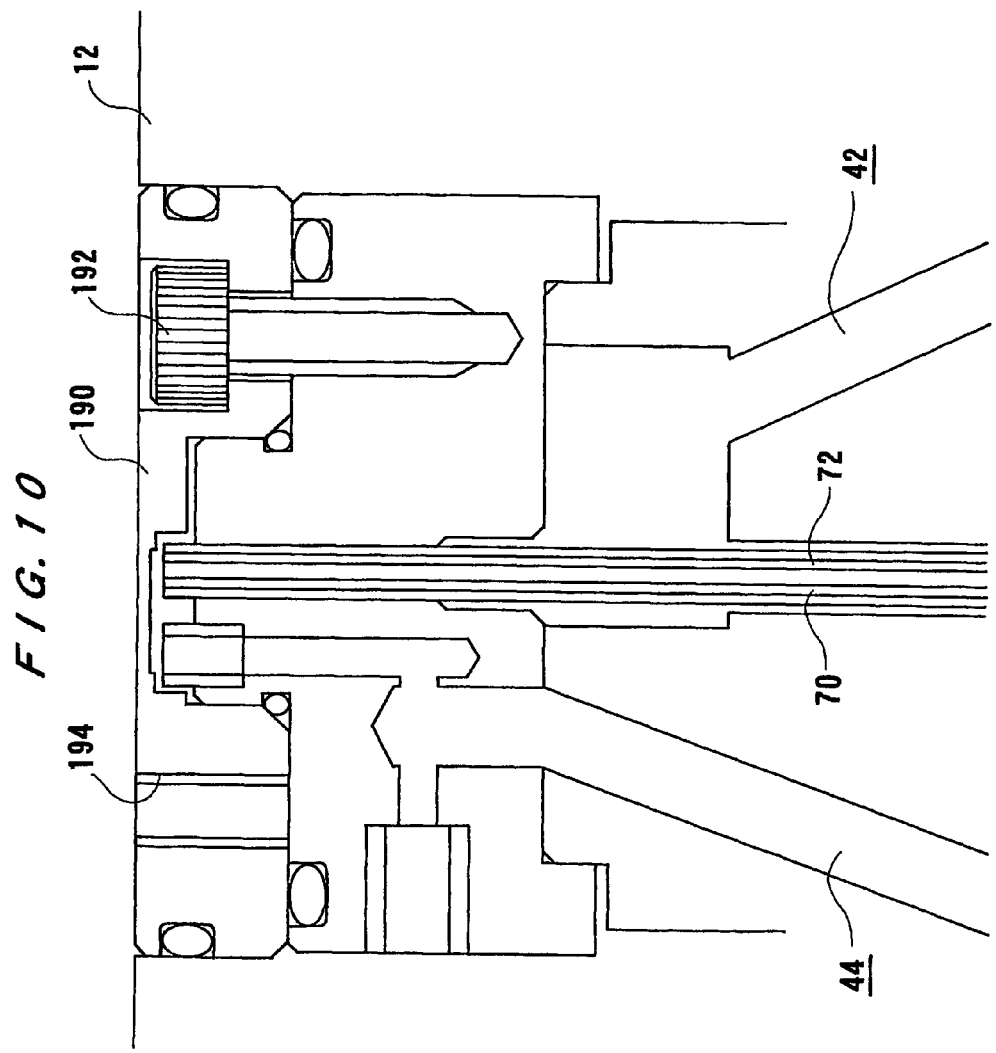
FIG. 10 is a cross-sectional view showing a protection cover in the arrangement shown in FIG. 4.

If replacement of the polishing pad 18 requires a long period of time, it is desirable that a protection cover be attached to the supply passage 42 and the discharge passage 44 so as to prevent the optical fibers 70 and 72 from being dried. FIG. 10 shows a protection cover 190 attached to the supply passage 42 and the discharge passage 44 for this purpose. As shown in FIG. 10, the protection cover 190 is detachably attached to the polishing table 12 by hexagonal socket head cap screws 192.

At a time of replacement of the polishing pad 18, the protection cover 190 is fitted into the through-hole 68 (see FIG. 4) in the polishing pad 18 in a state such that the supply passage 42 and the discharge passage 44 are filled with pure water after respective portions of the polishing table 12 are cleaned. Then, the protection cover 190 is fixed to the polishing table 12 by the hexagonal socket head cap screws 192. The protection cover 190 is designed so that an upper surface of the protection cover 190 is aligned with an upper surface of the polishing table 12. Further, the hexagonal socket head cap screws 192 are disposed inside of the protection cover 190, and upper surfaces of the hexagonal socket head cap screws 192 are positioned below the upper surface of the polishing table 12. Then, an old polishing pad is removed from the polishing table 12, and a new polishing pad is attached to the polishing table 12. The new polishing pad is attached to the polishing table 12 so that the protection cover 190 attached to the polishing table 12 is positioned within a through-hole 68 of the new polishing pad. In this case, a guide member may be used to align the protection cover 190 in the through-hole of the new polishing pad.

After the new polishing pad is attached to the polishing table 12, the hexagonal socket head cap screws 192 are removed from the protection cover 190. Then, screws having a length of about 12 mm are inserted into through-holes 194 formed in the protection cover 190 to lift and remove the protection cover 190 from the polishing table 12. At that time, the screws are slowly inserted into three through-holes 194 in turn, so that the protection cover 190 can reliably be removed from the polishing table 12 without any engagement.

Thus, the supply passage 42 and the discharge passage 44 are covered with the protection cover 190 to protect the optical fibers 70 and 72 and to prevent the optical fibers 70 and 72 from being dried at a time of replacement of the polishing pad or conveyance or long-term storage of the polishing table 12. Pure water may continuously be supplied through the supply passage 42 to prevent the optical fibers 70 and 72 from being dried when the protection cover 190 is attached to the polishing table 12. At that time, compulsory discharge of pure water may be performed through the discharge passage 44. In order to prevent reproduction of microorganisms to achieve long-term storage, a surface-active agent, an antiseptic, or an organic solvent such as a trace of alcohol may be mixed in pure water to be supplied.

A preferred embodiment of the present invention has been described above. It would be apparent to those skilled in the art that many variations may be made in the present embodiment without departing from the scope of the present invention. For example, a measurement fluid is not limited to pure water.

As described above, according to the present invention illustrated in FIGS. 1 through 10, since supply of a measurement fluid into a fluid chamber is controlled according to a positional relationship between the fluid chamber and a substrate, fluid supply can be restricted within a range in which a measuring capability can be maintained. Therefore, an outflow of the measurement fluid can be reduced, and influence on polishing performance from the measurement fluid can be reduced.

According to the present invention, a measurement fluid is supplied to a fluid chamber at a low flow rate during an unblocking period, during which the fluid chamber is not blocked by a substrate. Thus, while slurry is prevented from entering the fluid chamber, the measurement fluid is prevented from flowing out during the unblocking period.

Further, according to the present invention, since compulsory discharge is controlled together with supply of a measurement fluid, a measurement fluid is properly prevented from flowing out of a fluid chamber to a surface of a polishing pad. Thus, an amount of outflow can further be reduced. According to the present invention, compulsory discharge is restricted during the pre-blocking period. Thus, it is possible to increase an amount of measurement fluid in the fluid chamber and to reduce an amount of slurry flowing into the fluid chamber when the fluid chamber passes through slurry pools immediately before the fluid chamber is moved below the substrate, thereby improving measuring performance.

FIG. 11 is a view explanatory of a substrate polishing apparatus 10 according to a second embodiment of the present invention, which shows measurement portions of a polishing table (rotatable table) 12 in an enlarged manner. FIG. 11 corresponds to a portion of the sensor 24 in the entire arrangement shown in FIG. 1. As described above, a polishing pad 18 is placed on a polishing pad attachment surface 78 of the polishing table 12, and a substrate 20 is brought into contact with the polishing pad 18. A supply passage 42 and a discharge passage 44 are provided adjacent each other in the polishing table 12.

The polishing pad 18 has a through-hole (opening) 68, and the supply passage 42 and the discharge passage 44 communicate with the through-hole 68. A pipe piece 1086 is mounted on the polishing table 12 for forming the supply passage 42 in the through-hole 68. An end of the pipe piece 1086 forms an outlet 1088 for a measurement fluid. The outlet 1088 serves as a supply port for supplying a measurement fluid, which is supplied through the supply passage 42, into the through-hole 68. The pipe piece 1086 is located within the through-hole 68. Specifically, the outlet 1088 is located above the polishing table 12 and near a polishing surface 16 of the polishing pad 18.

The pipe piece 1086 is an annular component and is attached to the polishing table 12 at a threaded portion 1092. More specifically, the threaded portion 1092 is formed by an external thread on the pipe piece 1086 and an internal thread on the polishing table 12, which are coupled to each other. The threaded portion 1092 is arranged such that the outlet 1088 on an upper end of the pipe piece 1086 is located at a proper height in the through-hole 68 when the pipe piece 1086 is fasten to the polishing table 12. Although an exchangeable pipe piece 1086 is used in the present embodiment, a pipe that is fixed on the polishing table 12 and is not exchangeable may be used within the scope of the present invention.

In the substrate polishing apparatus 10 according to the present embodiment, a measurement fluid, such as pure water, is supplied through the supply passage 42 and discharged through the discharge passage 44. An interior of the through-hole 68 is filled with transparent pure water, and slurry used for polishing is prevented from entering the through-hole 68. Thus, it is possible to perform measurement using transmitted light.

A light-emitting optical fiber 1080 and a light-receiving optical fiber 1082 are disposed within the supply passage 42. The light-emitting optical fiber 1080 and the light-receiving optical fiber 1082 are connected to light source unit 30 and photometer unit 32 (see FIG. 1). The light-emitting optical fiber 1080 applies measurement light, which is supplied from the light source unit 30, to the substrate 20. The light-receiving optical fiber 1082 receives reflected light from the substrate 20 and transmits it to the photometer unit 32.

Next, there will be described an arrangement of the light-emitting optical fiber 1080 and the light-receiving optical fiber 1082 for improving a light-receiving efficiency of reflected light from the substrate 20. In the present embodiment, the light-emitting optical fiber 1080 and the light-receiving optical fiber 1082 are disposed adjacent each other and held in contact with each other. With such an arrangement of the light-emitting optical fiber 1080 and the light-receiving optical fiber 1082, an emitting end 1094 of the light-emitting optical fiber 1080 and an incident end 1096 of the light-receiving optical fiber 1082 are disposed adjacent each other and directed toward the substrate 20. The light-emitting optical fiber 1080 and the light-receiving optical fiber 1082 are disposed so as to have a distance L from the emitting end 1094 of the light-emitting optical fiber 1080 and the incident end 1096 of the light-receiving optical fiber 1082 to the substrate 20.

There will be described below reasons why the above arrangement can improve a light-receiving efficiency of measurement light. First, reasons why the light-emitting optical fiber and the light-receiving optical fiber are disposed adjacent each other will be described, and then setting of a distance L from the light-emitting optical fiber and the light-receiving optical fiber to the substrate will be described.

Figures 12A, 12B:
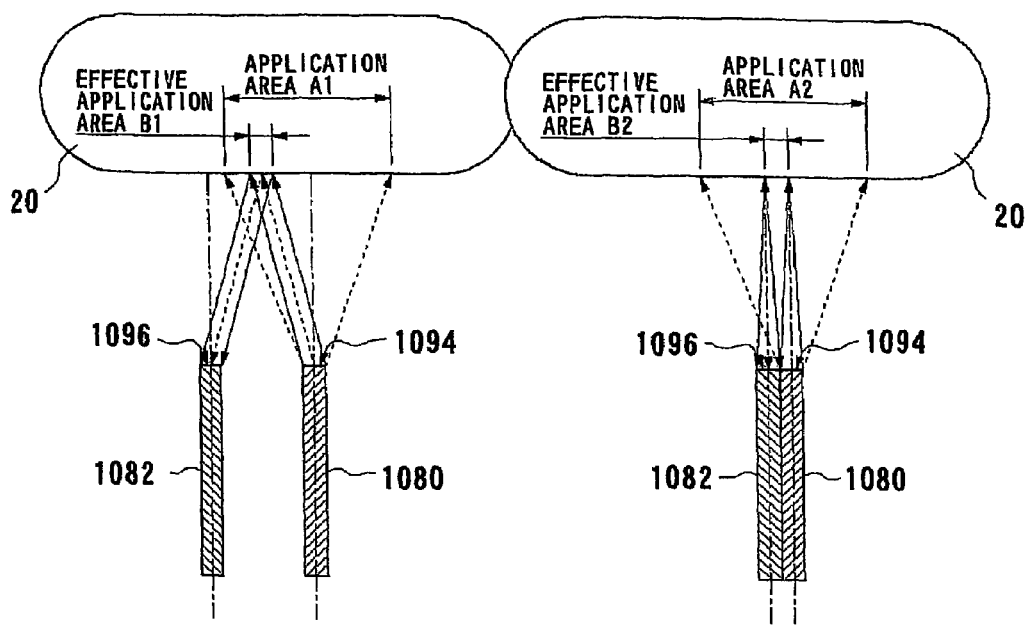
FIGS. 12A and 12B are schematic diagrams showing light-emitting and light-receiving between a light-emitting optical fiber and a light-receiving optical fiber and a substrate.

FIGS. 12A and 12B are schematic diagrams showing the light-emitting optical fiber 1080, the light-receiving optical fiber 1082, and the substrate 20. FIG. 12A shows an example in which the light-emitting optical fiber 1080 and the light-receiving optical fiber 1082 are spaced from each other, and FIG. 12B shows an example in which the light-emitting optical fiber 1080 and the light-receiving optical fiber 1082 are disposed adjacent each other. The example shown in FIG. 12B corresponds to an arrangement of optical fibers in the present embodiment. As shown in FIG. 12A, measurement light, emitted from the light-emitting optical fiber 1080, is applied to the substrate 20. The measurement light applied to the substrate 20 is reflected from the substrate 20, and a portion of this reflected light is received by the light-receiving optical fiber 1082. A range to which measurement light to be received by the light-receiving optical fiber 1082 is applied is referred to as an "effective application area". Next, a quantity of measurement light applied to the effective application area will be described below.

Figure 12C:
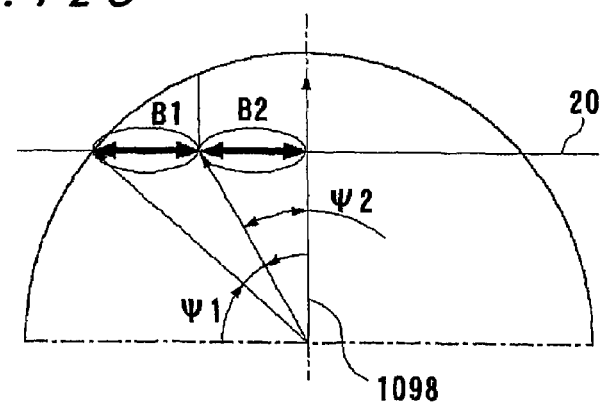
FIG. 12C is a diagram explanatory of a quantity of measurement light emitted to an effective application area.

FIG. 12C is a diagram explanatory of a quantity of measurement light emitted to an effective application area B1 shown in FIG. 12A and a quantity of measurement light emitted to an effective application area B2 shown in FIG. 12B. Generally, a quantity of light in a region is specified by a solid angle cutting the region. As shown in FIG. 12C, a solid angle $\Psi 1$ of the effective application area B1 is smaller than a solid angle $\Psi 2$ of the effective application area B2. Specifically, the quantity of light emitted to the effective application area B2 shown in FIG. 12B is larger than the quantity of light emitted to the effective application area B1 shown in FIG. 12A. As can be seen from FIG. 12C, a range closer to a perpendicular 1098 from the emitting end 1094 to the substrate 20 has a larger solid angle, which cuts the same area on the substrate 20. Specifically, an effective application area located closer to a front of the emitting end 1094 has a larger quantity of emitted light. Based on the above principles, the light-emitting optical fiber 1080 and the light-receiving optical fiber 1082 are disposed so that the emitting end 1094 of the light-emitting optical fiber 1080 and the incident end 1096 of the light-receiving optical fiber 1082 are adjacent each other. With this arrangement, because a path of the measurement light is brought closer to being perpendicular to the substrate 20, the quantity of light emitted to the effective application area is increased. Thus, a light-receiving efficiency of measurement light can be improved.

Next, there will be described setting of a distance L from the emitting end 1094 of the light-emitting optical fiber 1080 and the incident end 1096 of the light-receiving optical fiber 1082 to the substrate 20.

When the light-emitting optical fiber 1080 and the light-receiving optical fiber 1082 are brought close to the substrate 20, a quantity of light emitted to the substrate 20 is increased per area. However, if the light-emitting optical fiber 1080 and the light-receiving optical fiber 1082 are excessively brought close to the substrate 20, then the quantity of reflected light to be received is reduced. These points of view will be described sequentially, and then setting of an optimal distance L from the light-emitting optical fiber 1080 and the light-receiving optical fiber 1082 to the substrate 20 for improving a light-receiving efficiency will be described.

There will be described with reference to FIGS. 13A and 13B reasons why the quantity of measurement light received is increased when the light-emitting optical fiber 1080 and the light-receiving optical fiber 1082 are brought close to the substrate 20.

Figure 13A:
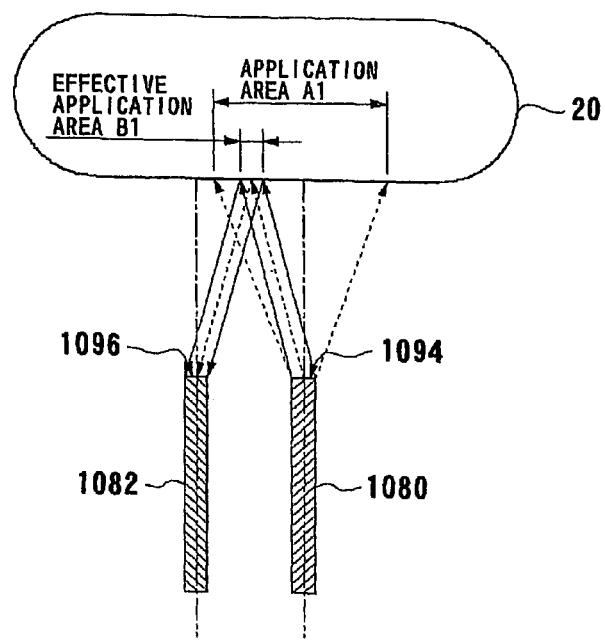
FIG. 13A is a schematic diagram showing light-emitting and light-receiving between a light-emitting optical fiber and a light-receiving optical fiber and a substrate.

FIG. 13A is a schematic diagram showing the light-emitting optical fiber 1080, the light-receiving optical fiber 1082, and the substrate 20. As shown in FIG. 13A, measurement light emitted from the light-emitting optical fiber 1080 is applied to the substrate 20. The measurement light applied to the substrate 20 is reflected from the substrate 20, and a portion of this reflected light is received by the light-receiving optical fiber 1082. Specifically, light of the measurement light applied to the substrate which is applied to the effective application area B1 shown in FIG. 13A reaches the light-receiving optical fiber 1082. Therefore, the quantity of light emitted to the effective application area B1 relates to a quantity of light received by the light-receiving optical fiber 1082. A relationship between the quantity of light emitted to the effective application area B1 and a distance will be described with reference to FIG. 13B.

Figure 13B:
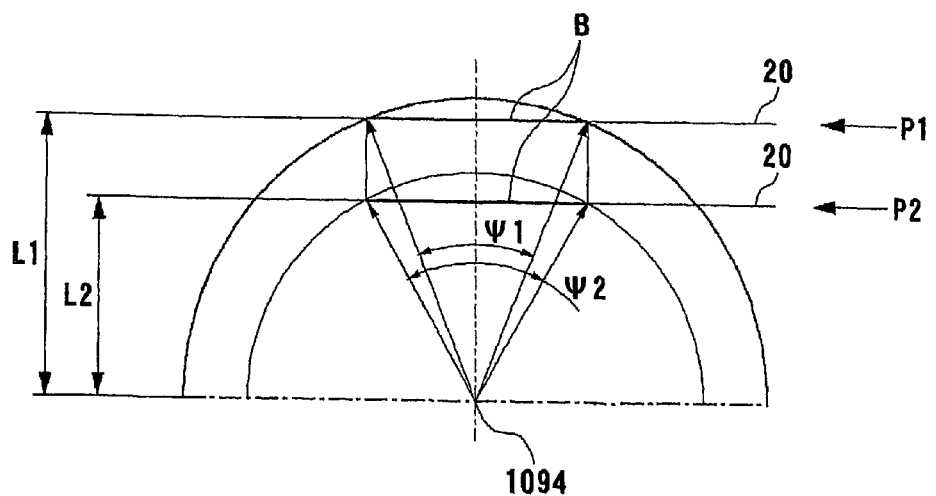
FIG. 13B is a diagram showing a relationship between a distance from an emitting end of a light-emitting optical fiber to a substrate and a quantity of light applied to the substrate.

FIG. 13B is a diagram showing a relationship between a distance from the emitting end 1094 of the light-emitting optical fiber 1080 to the substrate 20 and a quantity of light applied to the substrate 20 per area. FIG. 13B comparatively shows a case in which the substrate 20 is located at a position P1 and a case in which the substrate 20 is located at a position P2. In the case where the substrate 20 is located at the position P1, the quantity of light applied to region B of the substrate 20 is represented by a solid angle $\Psi 1$, which cuts region B. In the case where the substrate 20 is located at the position P2, the quantity of light applied to region B of the substrate 20 is represented by a solid angle $\Psi 2$. Here, comparison of quantities of light applied to the same region B in the cases of position P1 and position P2 shows that a quantity of applied light in the case where the substrate 20 is located at the position P2 is larger than that in the case where the substrate 20 is located at the position P1 ($\Psi 1 < \Psi 2$). Specifically, FIG. 13B shows that the quantity of light applied to the substrate 20 per area is increased when a distance from the emitting end 1094 of the light-emitting optical fiber 1080 to the substrate 20 is reduced. Therefore, in order to increase the quantity of light emitted to the effective application area B1 and to increase the quantity of light received by the light-receiving optical fiber 1082, it is desirable that a distance from the emitting end 1094 to the substrate 20 is short.

Figure 14A:
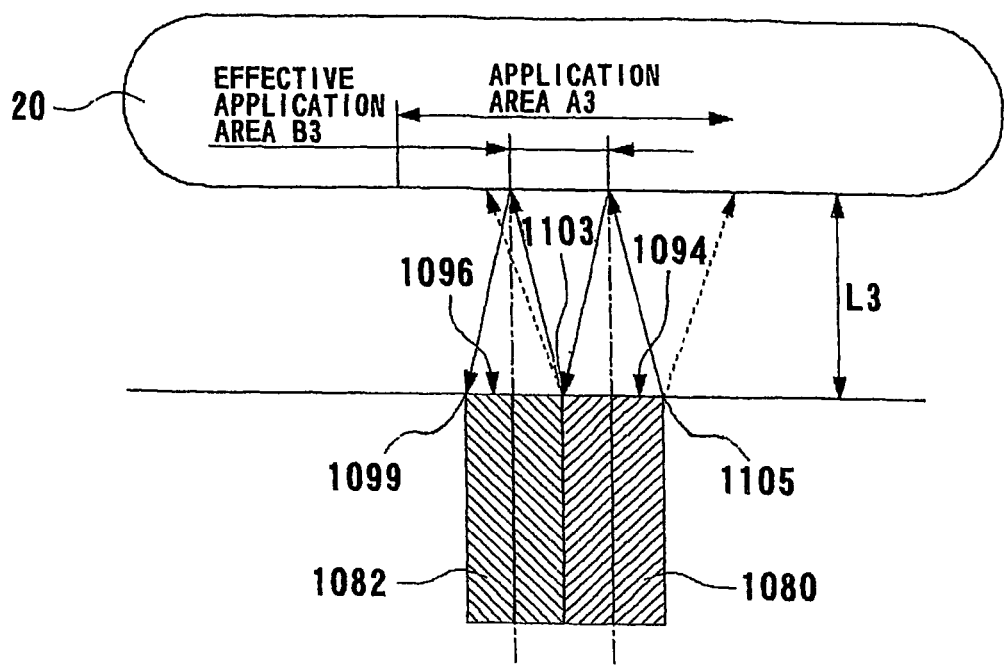
FIGS. 14A and 14B are schematic diagrams explanatory of a relationship between a distance from a light-emitting optical fiber and a light-receiving optical fiber to a substrate and an effective application area on the substrate.
Figure 14B:
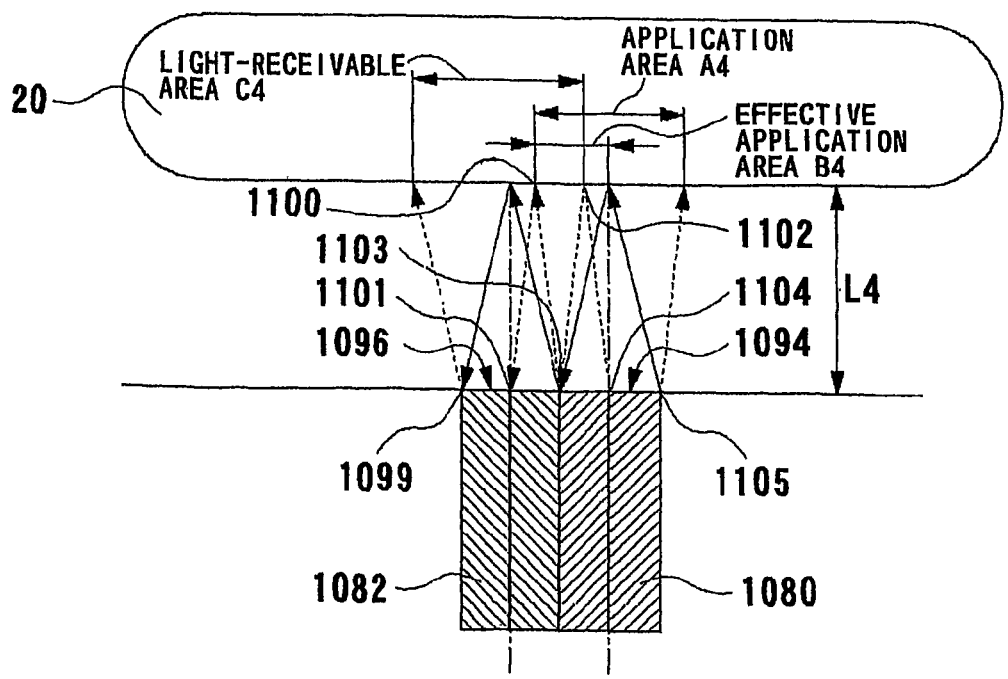

However, when the light-emitting optical fiber 1080 and the light-receiving optical fiber 1082 are brought excessively close to the substrate 20, the quantity of light reflected from the substrate 20 is reduced for the following reasons. FIGS. 14A and 14B will be referred. Here, thicknesses of clads and coatings of the fibers are ignored for easy understanding.

FIGS. 14A and 14B are schematic diagrams explanatory of a relationship between distances L3, L4 from the light-emitting optical fiber 1080 and the light-receiving optical fiber 1082 to the substrate 20 and effective application areas B3, B4 of the substrate 20. As shown in FIGS. 14A and 14B, measurement light emitted from the light-emitting optical fiber 1080 is applied to the substrate 20. The measurement light applied to the substrate 20 is reflected from the substrate 20, and a portion of this reflected light is received by the light-receiving optical fiber 1082. The emitting end 1094 of the light-emitting optical fiber 1080 and the incident end 1096 of the light-receiving optical fiber 1082 in the example shown in FIG. 14B are positioned closer to the substrate as compared to the example shown in FIG. 14A.

As shown in FIG. 14A, when a distance L3 is long, the measurement light emitted from the light-emitting optical fiber 1080 can reach an edge 1099 of the incident end 1096 of the light-receiving optical fiber 1082. In this case, a width of the effective application area B3 is determined by a width of the emitting end 1094 of the light-emitting optical fiber 1080. As can be seen from FIG. 14A, application area A3 increasingly becomes larger when the distance L3 is longer, and a size of the effective application area B3 included in the application area A3 is maintained constant.

However, as shown in FIG. 14B, when distance L4 is short, the effective application area B4 becomes smaller because of angles of divergence of the optical fibers 1080, 1082 for emitting and receiving light. Specifically, in FIG. 14B, light reflected from a point 1100 in application area A4, which is the nearest point to the light-receiving optical fiber 1082, is received at a point 1101, which is located near a center of the incident end of the light-receiving optical fiber 1082. In other words, no light is received at portions ranging from incident point 1101 to the edge 1099. Further, light reflected from a point 1102 in a light-receivable area C4, which is the nearest point to the light-emitting optical fiber 1080, is received at an edge 1103 of the incident end 1096 of the light-receiving optical fiber 1082. Specifically, light emitted from a surface ranging from point 1104 to edge 1105 on the emitting end 1094 of the light-emitting optical fiber 1080 does not reach the light-receiving optical fiber 1082. Accordingly, the effective application area B4 becomes small. As can be seen from FIG. 14B, the effective application area B4 becomes smaller when the distance L4 is shorter, and the quantity of received light is reduced. On the assumption that a distance between cores of the light-emitting optical fiber 1080 and the light-receiving optical fiber 1082 is zero, the quantity of light received by the light-receiving optical fiber 1082 is zero when L4=0.

As described above, an arrangement of the light-emitting optical fiber and the light-receiving optical fiber to improve a light-receiving efficiency of the measurement light is an arrangement in which the light-emitting optical fiber 1080 and the light-receiving optical fiber 1082 are positioned closest to the substrate 20 as long as an effective application area having a size as shown in FIG. 14A can be maintained. Next, the distance L meeting these conditions will be calculated.

Figure 15:
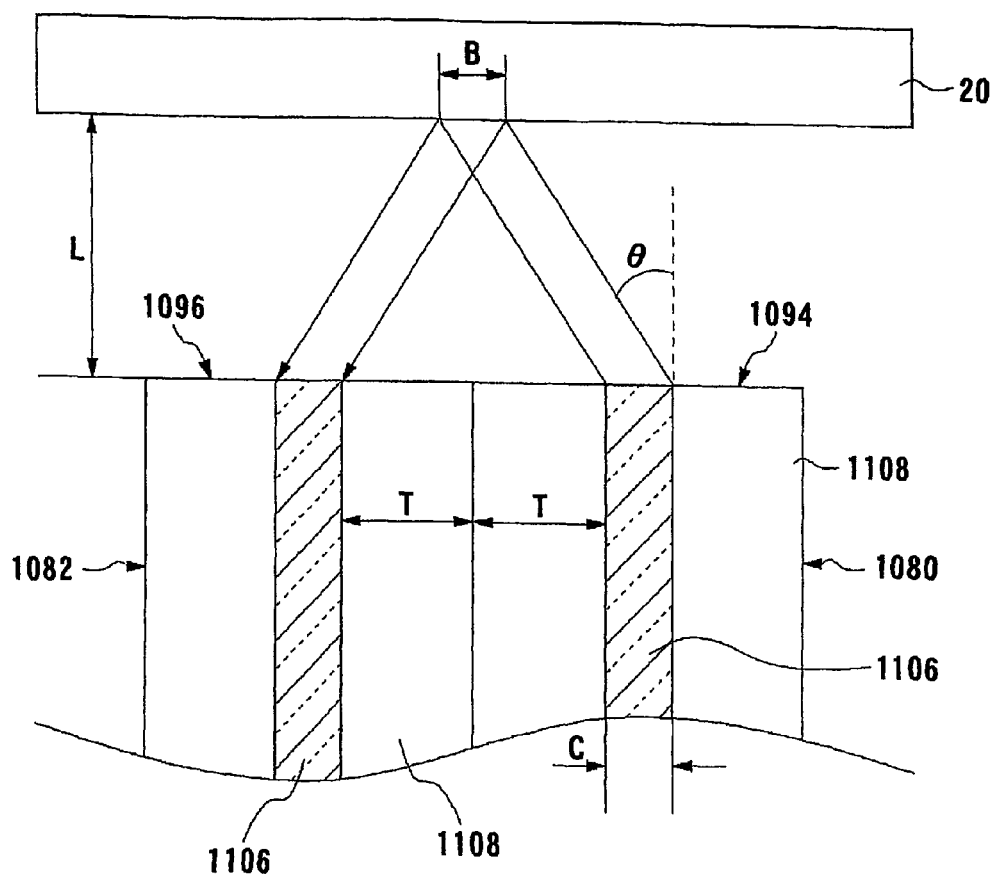
FIG. 15 is a diagram showing a light-emitting optical fiber, a light-receiving optical fiber, and a substrate.

FIG. 15 is a diagram showing the light-emitting optical fiber 1080, the light-receiving optical fiber 1082, and the substrate 20. The light-emitting optical fiber 1080 and the light-receiving optical fiber 1082 are disposed adjacent each other. A clad 1108 of the light-emitting optical fiber 1080 and a clad 1108 of the light-receiving optical fiber 1082 are interposed between a core 1106 of the light-emitting optical fiber 1080 and a core of the light-receiving optical fiber 1082. The core 1106 of the light-emitting optical fiber 1080 and the core of the light-receiving optical fiber 1082 are spaced by a thickness of the clads 1108. Here, the light-emitting optical fiber 1080 and the light-receiving optical fiber 1082 are the same type of optical fiber. The clads 1108 have a thickness T. Practically, the clads 1108 may be covered with a covering layer, and the covering layer may further be coated with a coating layer. In such cases, thicknesses of the covering layer and the coating layer may be included in the thickness T. Here, a minimum value of the distance L is calculated so as not to reduce a size of an effective application area as follows. When C is a diameter of the core 1106 of the optical fiber, and N is a numerical aperture (NA value) thereof, the following relationship holds from FIG. 15.

$$\tan \theta = (2T+C)/2L \quad (1)$$

The NA value in air (having a refractive index of 1) is represented by $\sin \theta$.

$$N = \sin \theta \quad (2)$$

Formula (1) and formula (2) are solved for the distance L.

$$L = (1-N^2)^{1/2} \times (2T+C)/2N \quad (3)$$

Therefore, the value represented by formula (3) is a minimum value of the distance L. The distance L meets the conditions that i) an effective application area is not reduced, and that ii) the light-emitting optical fiber 1080 and the light-receiving optical fiber 1082 are brought close to the substrate 20. Accordingly, the value represented by formula (3) is an optimal value of the distance L.

In an actual substrate polishing apparatus 10, an optimal value of the distance L may be varied by a slight inclination of the optical fibers, conditions of paths of measurement light, and the like. Near the distance L, reduction of the quantity of received light due to reduction of an effective application area is cancelled by increase of a quantity of received light due to proximity of the optical fiber ends 1094, 1096. Resulted changes of a total quantity of received light differ according to specifications of respective optical fibers 1080, 1082. Therefore, it is desirable to adjust the distance from the light-emitting optical fiber 1080 and the light-receiving optical fiber 1082 to the substrate 20 near the distance L calculated as described above, thereby achieving an arrangement which can maximize a light-receiving efficiency.

Figure 16:
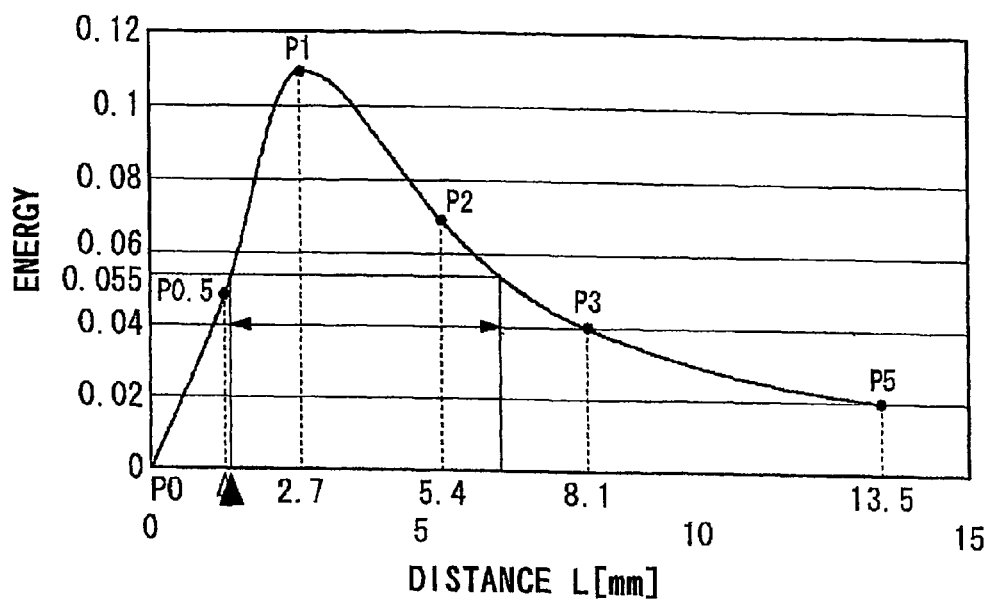
FIG. 16 is a result of an experiment for a relationship between a distance L from a light-emitting optical fiber and a light-receiving optical fiber to a substrate and a quantity of light received by the light-receiving optical fiber.

FIG. 16 is a result of an experiment conducted for calculating a relationship between the distance from the light-emitting optical fiber 1080 and the light-receiving optical fiber 1082 to the substrate 20 and the quantity of light received by the light-receiving optical fiber 1082. Here, a light-emitting optical fiber 1080 and a light-receiving optical fiber 1082 were provided in a pipe piece 1086 which had a mirror-finished inner surface. The light-emitting optical fiber 1080 and the light-receiving optical fiber 1082 were arranged so that an emitting end 1094 of the light-emitting optical fiber 1080 and an incident end 1096 of the light-receiving optical fiber 1082 were positioned 2 mm below an outlet 1088 of a pipe end. With the above arrangement, a distance from the pipe end to a substrate 20 was set as L in FIG. 16. According to a result, it can be seen that the quantity of received light became a maximum value when the distance L was 2.7 mm. When the distance was less than 2.7 mm, the quantity of received light was rapidly reduced. When the distance was more than 2.7 mm, the quantity of received light was also reduced. This result in the experiment coincides with the above description that there is an optimal distance to maximize a light-receiving efficiency.

The preferred second embodiment of the present invention has been described above. In the substrate polishing apparatus 10 according to the present embodiment, the light-emitting optical fiber 1080 and the light-receiving optical fiber 1082 are disposed adjacent each other. A path of measurement light which is emitted from the light-emitting optical fiber 1080 and then received by the light-receiving optical fiber 1082 becomes substantially perpendicular to the substrate 20. Specifically, an effective application area for performing film measurement of the substrate 20 is positioned substantially on a front of the emitting end 1094 of the light-emitting optical fiber 1080 and the incident end 1096 of the light-receiving optical fiber 1082. Accordingly, it is possible to increase a quantity of light emitted to an effective application area and to increase a quantity of light received by the light-receiving optical fiber 1082.

Further, the distance L from the emitting end 1094 of the light-emitting optical fiber 1080 and the incident end 1096 of the light-receiving optical fiber 1082 to the substrate 20 is calculated based on angles of divergence of the light-emitting optical fiber 1080 and the light-receiving optical fiber 1082. More specifically, the distance L is set at a small value based on the angles of divergence as long as the effective application area is not reduced. Then, the light-emitting optical fiber 1080 and the light-receiving optical fiber 1082 are disposed based on calculated distance L to enhance a light-receiving efficiency of measurement light.

Next, a substrate polishing apparatus 10 according to a third embodiment of the present invention will be described below. The substrate polishing apparatus 10 in the third embodiment basically has the same arrangement as the substrate polishing apparatus 10 in the second embodiment, but has a different arrangement of a light-emitting optical fiber 1080 and a light-receiving optical fiber 1082.

Figure 17:
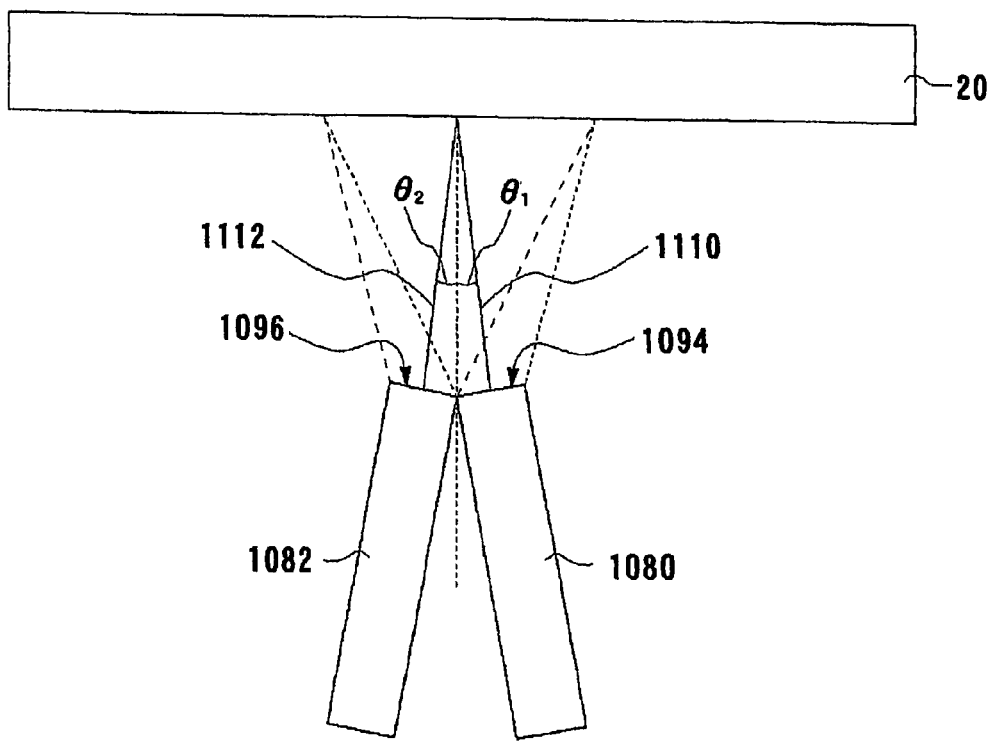
FIG. 17 is a diagram showing an arrangement of a light-emitting optical fiber and a light-receiving optical fiber according to a third embodiment of the present invention.

FIG. 17 is a diagram showing an arrangement of the light-emitting optical fiber 1080 and the light-receiving optical fiber 1082 in the substrate polishing apparatus 10 according to the third embodiment. In the substrate polishing apparatus 10 according to the third embodiment, an optical axis 1110 of the light-emitting optical fiber 1080 and an optical axis 1112 of the light-receiving optical fiber 1082 are inclined. More specifically, the optical axis 1110 of the light-emitting optical fiber 1080 is inclined toward the light-receiving optical fiber 1082. The optical axis 1112 of the light-receiving optical fiber 1082 is inclined toward the light-emitting optical fiber 1080. The optical axis 1110 of the light-emitting optical fiber 1080 is inclined at an angle $\theta 1$ with respect to a normal line of substrate 20, and the optical axis 1112 of the light-receiving optical fiber 1082 is inclined at an angle $\theta 2$ with respect to the normal line of the substrate 20.

Strong light is emitted from the optical fiber 1080 in a direction in which the optical axis 1110 extends. Since the optical axis 1110 of the light-emitting optical fiber 1080 is inclined toward the light-receiving optical fiber 1082, it is possible to enhance strength of light directed to the light-receiving optical fiber 1082. Further, the light-receiving optical fiber 1082 has high sensitivity to light entering from a direction along the optical axis 1112. Since the optical axis 1112 of the light-receiving optical fiber 1082 is inclined toward the light-emitting optical fiber 1080, it is possible to receive reflected light with high sensitivity. Thus, it is possible to improve a light-receiving efficiency of measurement light.

It is desirable that an inclination angle $\theta 1$ of the optical axis 1110 of the light-emitting optical fiber 1080 is equal to an inclination angle $\theta 2$ of the optical axis 1112 of the light-receiving optical fiber 1082. Since the inclination angles are equal, the optical axis 1110 of the light-emitting optical fiber 1080 and the optical axis 1112 of the light-receiving optical fiber 1082 are symmetrical with respect to a normal line of the semiconductor substrate 20. Therefore, a traveling direction of light reflected from the substrate 20 substantially coincides with the optical axis 1112 of the light-receiving optical fiber 1082. Thus, it is possible to improve a light-receiving efficiency of measurement light. In this case, the emitting end 1094 of the light-emitting optical fiber 1080 and the incident end 1096 of the light-receiving optical fiber 1082 may be shifted toward the substrate 20. When the light-receiving optical fiber 1082 is brought close to the substrate 20 according to an angle of divergence of the light-emitting optical fiber 1080, it is possible to reduce influence of disturbance.

Next, a substrate polishing apparatus 10 according to a fourth embodiment of the present invention will be described below. The substrate polishing apparatus 10 in the fourth embodiment basically has the same arrangement as the substrate polishing apparatus 10 in the third embodiment, but lenses are attached to a light-emitting optical fiber 1080 and a light-receiving optical fiber 1082.

Figure 18:
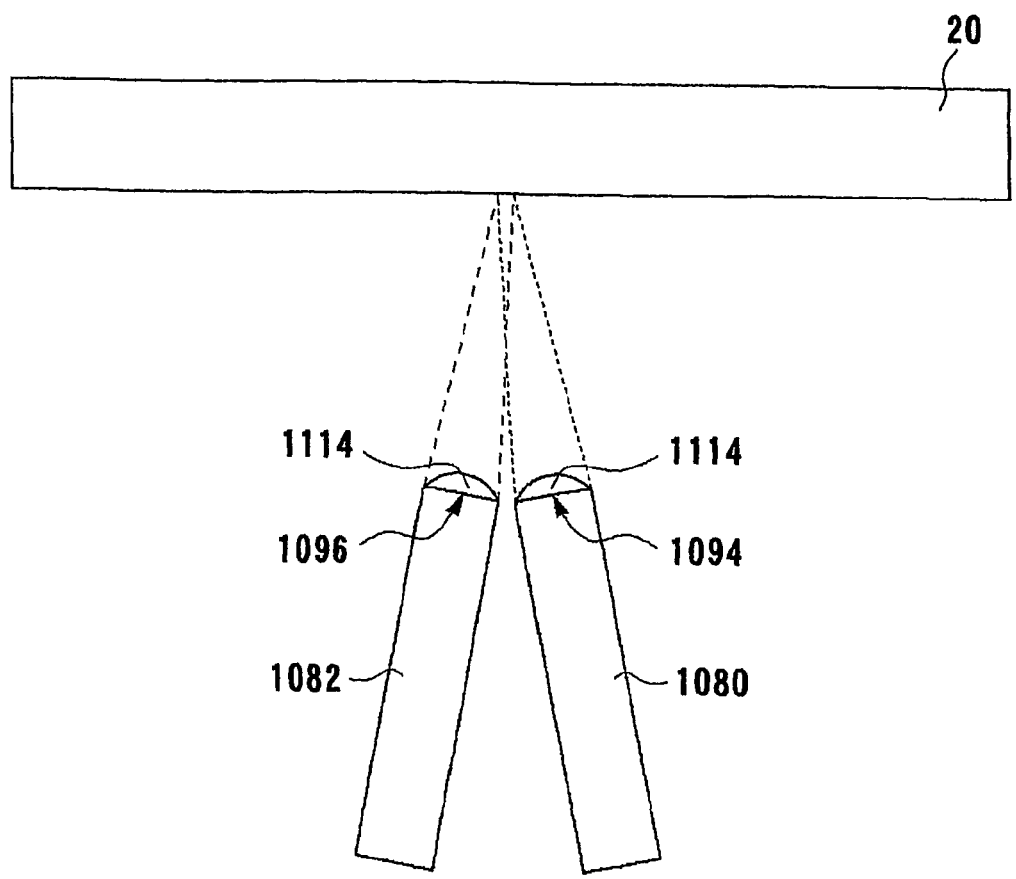
FIG. 18 is a diagram showing a light-emitting optical fiber and a light-receiving optical fiber according to a fourth embodiment of the present invention.

FIG. 18 is a diagram showing an arrangement of the light-emitting optical fiber 1080 and the light-receiving optical fiber 1082 in the substrate polishing apparatus 10 according to the fourth embodiment. As with the third embodiment, an optical axis of the light-emitting optical fiber 1080 and an optical axis of the light-receiving optical fiber 1082 are inclined. Further, lenses 1114 are attached to an emitting end 1094 of the light-emitting optical fiber 1080 and an incident end 1096 of the light-receiving optical fiber 1082, respectively. The lens 1114 attached to the light-emitting optical fiber 1080 has a function to condense measurement light emitted from the light-emitting optical fiber 1080 to the substrate 20. The lens 1114 attached to the light-receiving optical fiber 1082 has a function to condense light reflected from the substrate 20 to a core.

Figure 19A:
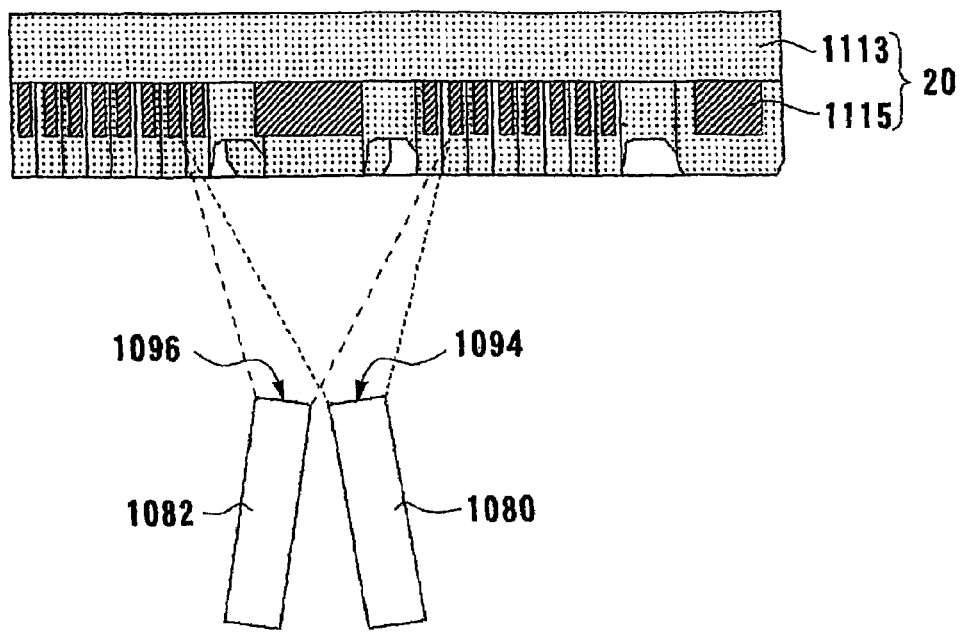
FIGS. 19A and 19B are schematic diagrams showing a surface of a substrate to be polished in an enlarged manner.
Figure 19B:
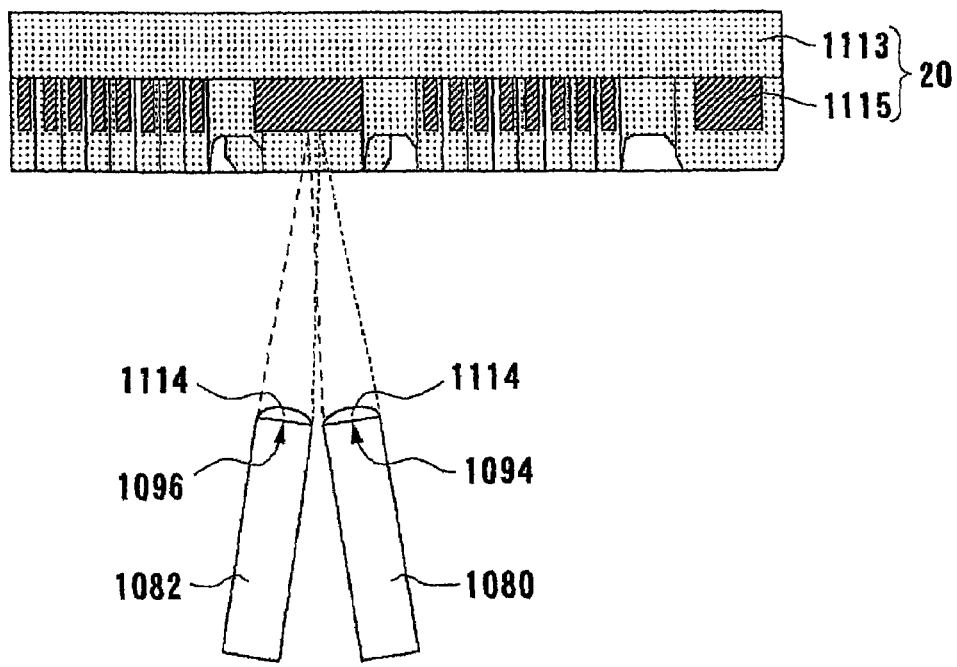

FIGS. 19A and 19B are schematic diagrams showing a surface of a substrate 20 to be polished in an enlarged manner. As shown in FIGS. 19A and 19B, the surface of the substrate 20 to be polished has a pattern. Specifically, A1 interconnections 1115 are formed on a $SiO_2$ substrate 1113 so as to form a pattern corresponding to the A1 interconnections 1115. As shown in FIG. 19A, the pattern has irregularities on a surface to which measurement light is emitted.

According to the present embodiment, since the lens 1114 attached to the emitting end 1094 of the light-emitting optical fiber 1080 condenses measurement light to the substrate 20, measurement light can be emitted limitedly to a small area. As shown in FIG. 19B, when measurement light is emitted to an area having no irregularities (e.g. relatively large interconnection portions), measurement of film thickness can accurately be performed based on reflected light. Particularly, this is effective in a case where properties of a film are measured by using interference of light. Further, light reflected from the substrate 20 is condensed by the lens 1114 attached to the light-receiving optical fiber 1082 and then received. Specifically, as shown in FIG. 19B, light from an area from which measurement light is reflected is condensed while light received from other areas is reduced. Thus, it is possible to reduce components of noise and to improve an S/N ratio of measurement light.

In the present embodiment, the lenses 1114 are attached to the emitting end 1094 of the light-emitting optical fiber 1080 and the incident end 1096 of the light-receiving optical fiber 1082. However, instead of attaching the lenses 1114, lenses may be formed by processing ends of the light-emitting optical fiber 1080 and the light-receiving optical fiber 1082.

Next, a substrate polishing apparatus 10 according to a fifth embodiment of the present invention will be described below. The substrate polishing apparatus 10 in the fifth embodiment basically has the same arrangement as the substrate polishing apparatus 10 in the second embodiment.

FIG. 20 is a cross-sectional view of a light-emitting optical fiber 1080 and a light-receiving optical fiber 1082 which are used in the substrate polishing apparatus 10 according to the fifth embodiment. In the present embodiment, the light-emitting optical fiber 1080 and the light-receiving optical fiber 1082 form an optical fiber member 1116. The light-receiving optical fiber 1082 covers the light-emitting optical fiber 1080. More specifically, a core of the light-emitting optical fiber 1080 is covered with a clad, and a core of the light-receiving optical fiber 1082 is provided outside of the clad. The core of the light-receiving optical fiber 1082 is further covered with a clad. The clad provided between the core of the light-emitting optical fiber 1080 and the core of the light-receiving optical fiber 1082 serves as a clad of the light-emitting optical fiber 1080 and as a clad of the light-receiving optical fiber 1082.

Figure 21A:
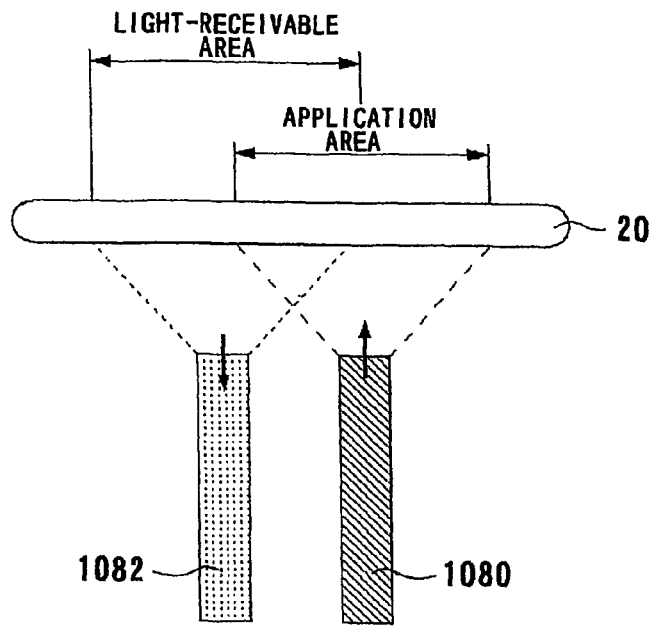
FIG. 21A is a diagram showing an application area and a light-receivable area in a conventional example.
Figure 21B:
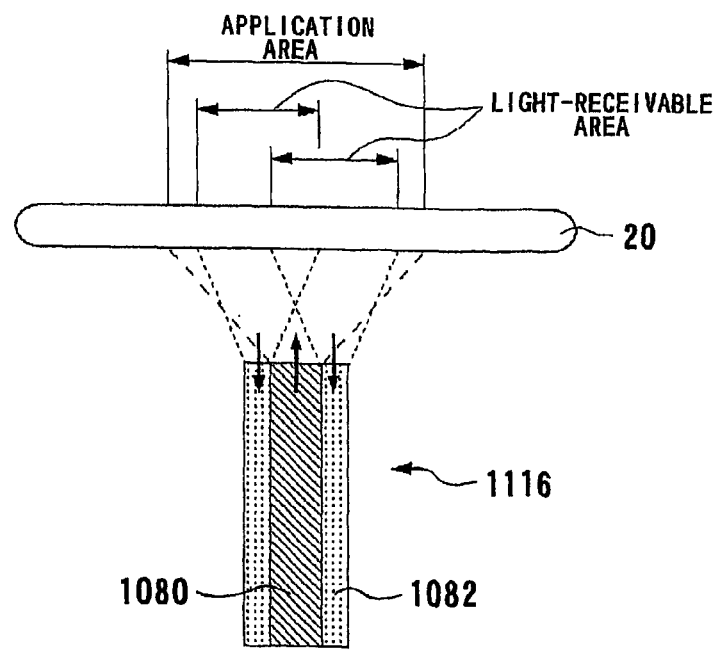
FIG. 21B is a diagram showing an application area and a light-receivable area in the fifth embodiment.

FIG. 21A is a diagram showing an application area of the light-emitting optical fiber 1080 and a light-receivable area of the light-receiving optical fiber 1082 in a conventional example, and FIG. 21B is a diagram showing an application area of the light-emitting optical fiber 1080 and a light-receivable area of the light-receiving optical fiber 1082 in the fifth embodiment. It can be seen from FIGS. 21A and 21B that since the light-receiving optical fiber 1082 surrounds the light-emitting optical fiber 1080 in the fifth embodiment, an application area of measurement light emitted from the light-emitting optical fiber 1080 and a light-receivable area of the light-receiving optical fiber 1082 have an overlapped area in the same direction. Therefore, it is possible to improve a light-receiving efficiency of measurement light reflected from the substrate 20.

In the fifth embodiment, the core of the light-emitting optical fiber 1080 and the core of the light-receiving optical fiber 1082 are disposed adjacent each other via a common clad. Since an interval between the cores is thus small, an application area of the light-emitting optical fiber 1080 and a light-receivable area of the light-receiving optical fiber 1082 can have a large overlapping area. Accordingly, the light-emitting optical fiber 1080 and the light-receiving optical fiber 1082 can be brought closer to the substrate 20. As described above, light received by the light-receiving optical fiber 1082 becomes substantially perpendicular to the substrate 20. Therefore, a solid angle becomes large during emitting light to thus increase a quantity of light.

The light-emitting optical fiber 1080 and the light-receiving optical fiber 1082 may be integrally formed by bonding or the like to form the optical fiber member 1116. The light-emitting optical fiber 1080 and the light-receiving optical fiber 1082 may be separated from each other. This also holds true in other embodiments.

Figure 22A:
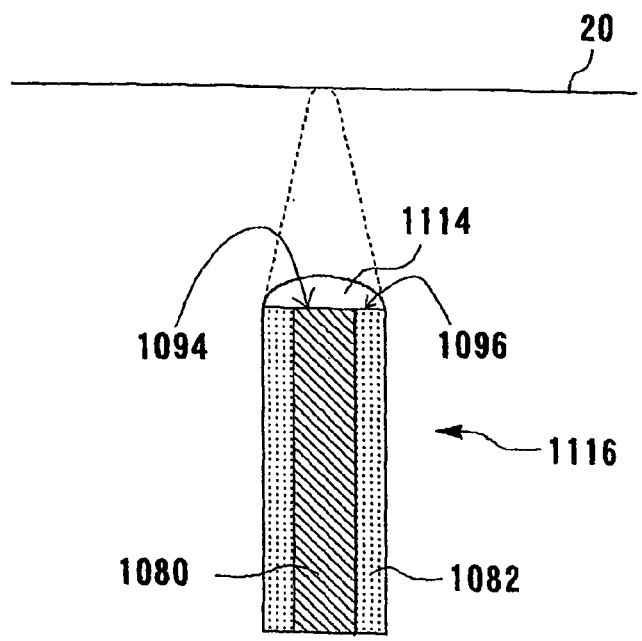
FIG. 22A is a diagram showing a light-emitting optical fiber and a light-receiving optical fiber which are used in a variation of the fifth embodiment.
Figure 22B:
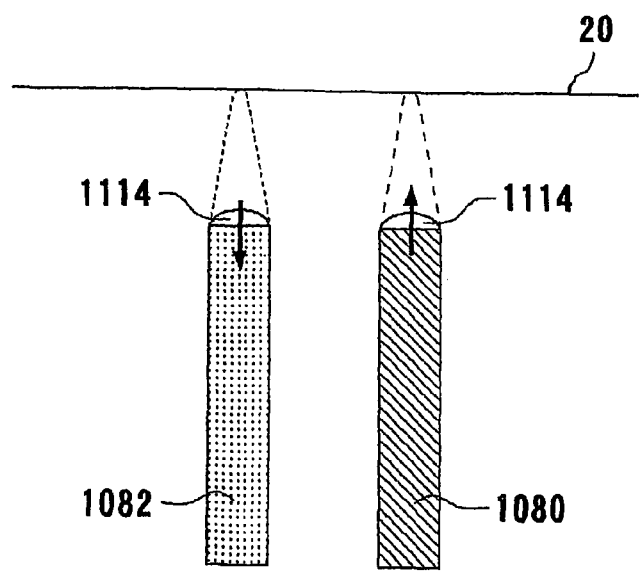
FIG. 22B is a configurational example in which lenses are attached to a light-emitting optical fiber and a light-receiving optical fiber.

FIG. 22A is a diagram showing a light-emitting optical fiber 1080 and a light-receiving optical fiber 1082 which are used in a variation of the fifth embodiment, and FIG. 22B is a configurational example in which lenses 1114 are attached to an emitting end 1094 of a light-emitting optical fiber 1080 and an incident end 1096 of a light-receiving optical fiber 1082, respectively. In the variation shown in FIG. 22A, a lens 1114 is attached so as to cover an emitting end 1094 of a light-emitting optical fiber 1080 and an incident end 1096 of a light-receiving optical fiber 1082. The lens 1114 has a function to condense measurement light emitted from the light-emitting optical fiber 1080 into a substrate 20, and to condense reflected light from the substrate 20. With this arrangement, a focal point to condense the measurement light and a focal point to condense the reflected light are common, unlike the example shown in FIG. 22B. Accordingly, the measurement light emitted from the light-emitting optical fiber 1080 can be condensed to the substrate 20, and the light reflected from the substrate 20 can be condensed to the light-receiving optical fiber 1082. Thus, it is possible to improve an S/N ratio of measurement light.

In the present embodiment, there has been described an arrangement in which the light-emitting optical fiber 1080 is covered with the light-receiving optical fiber 1082. However, the light-receiving optical fiber 1082 may be covered with the light-emitting optical fiber 1080. In the variation, the lens 1114 is attached to the light-emitting optical fiber 1080 and the light-receiving optical fiber 1082. A lens may be formed by processing the emitting end 1094 of the light-emitting optical fiber 1080 and the incident end 1096 of the light-receiving optical fiber 1082.

Next, a substrate polishing apparatus 10 according to a sixth embodiment of the present invention will be described below. The substrate polishing apparatus 10 in the sixth embodiment basically has the same arrangement as the substrate polishing apparatus 10 in the second embodiment.

Figure 23:
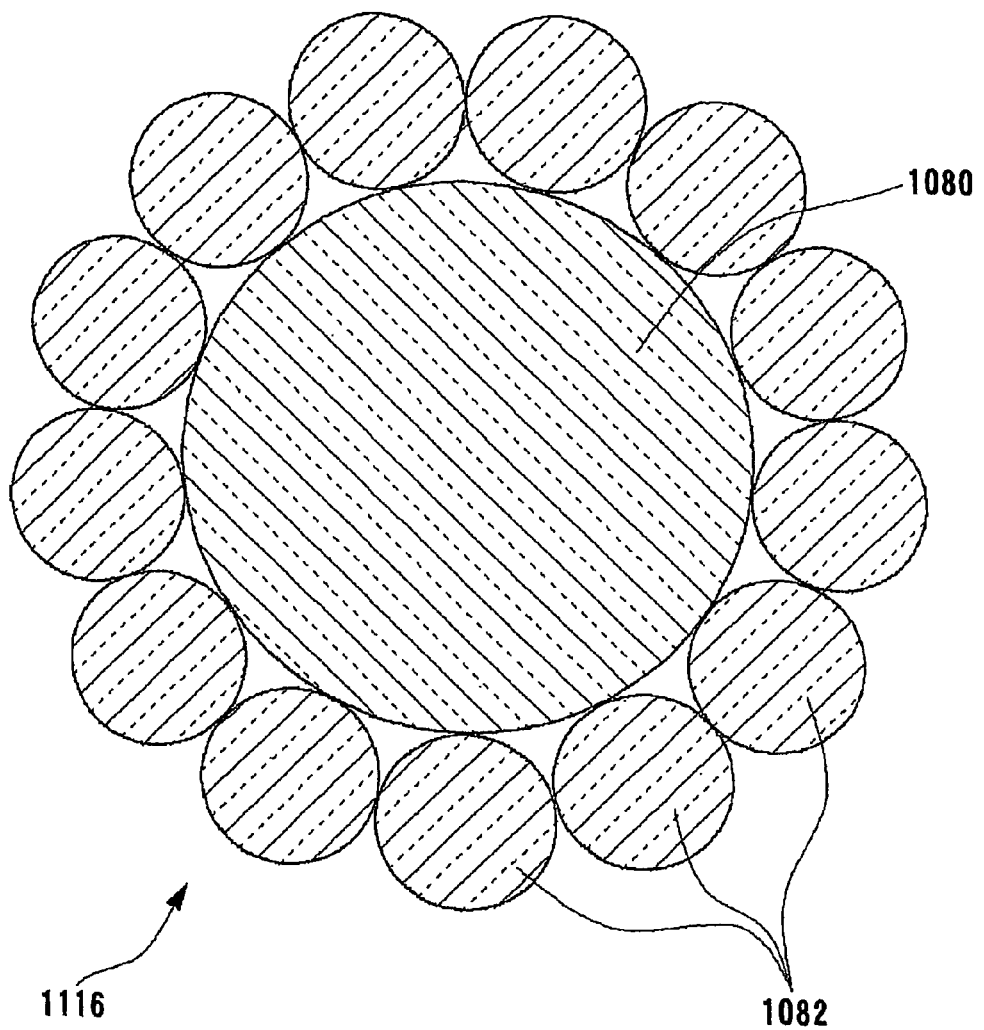
FIG. 23 is a cross-sectional view of a light-emitting optical fiber and light-receiving optical fibers which are used in a sixth embodiment of the present invention.

FIG. 23 is a cross-sectional view of a light-emitting optical fiber 1080 and light-receiving optical fibers 1082 which are used in the substrate polishing apparatus 10 according to the sixth embodiment. The light-emitting optical fiber 1080 and the light-receiving optical fibers 1082 form an optical fiber member 1116. In the present embodiment, the light-emitting optical fiber 1080 is surrounded by a plurality of light-receiving optical fibers 1082. The light-receiving optical fibers 1082 are arranged around the light-emitting optical fiber 1080 at equal intervals.

With an arrangement in which a plurality of light-receiving optical fibers 1082 is disposed around the light-emitting optical fiber 1080, it is possible to increase a ratio of receiving measurement light and improve an S/N ratio of the measurement light. In the substrate polishing apparatus 10, the light-emitting optical fiber 1080 and the light-receiving optical fibers 1082 are disposed in a supply passage 42 for supplying a measurement fluid. With an arrangement in which a plurality of light-receiving optical fibers 1082 is disposed around the light-emitting optical fiber 1080, a measurement fluid passes through spaces between the light-emitting optical fiber 1080 and the light-receiving optical fibers 1082 and spaces between the light-receiving optical fibers 1082. Thus, the light-emitting optical fiber 1080 and the light-receiving optical fibers 1082 are effectively cleaned by the measurement fluid.

Figure 24:
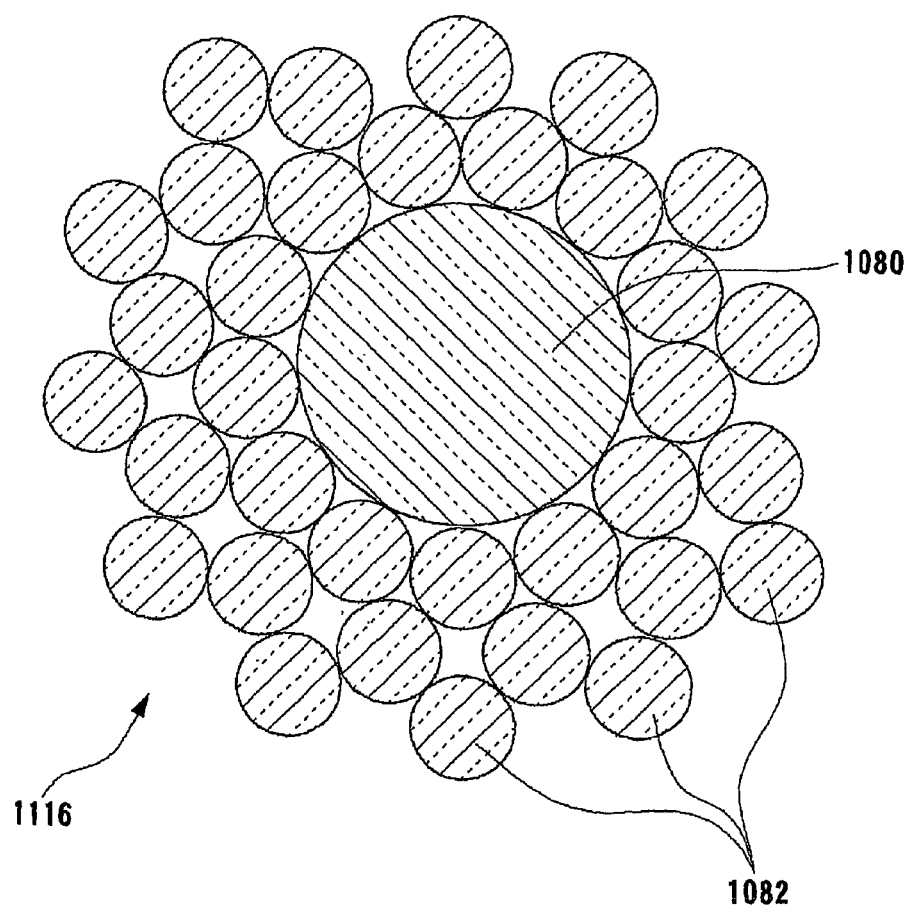
FIG. 24 is a cross-sectional view of a light-emitting optical fiber and light-receiving optical fibers which are used in a variation of the sixth embodiment.

FIG. 24 is a cross-sectional view of a light-emitting optical fiber 1080 and light-receiving optical fibers 1082 which are used in a variation of the sixth embodiment. This variation differs from the above embodiment in that a plurality of light-receiving optical fibers 1082 is disposed randomly so as to surround a light-emitting optical fiber 1080. Specifically, the plurality of light-receiving optical fibers 1082 is bundled around the light-emitting optical fiber 1080. This arrangement also has an advantage of improving a light-receiving efficiency of measurement light, as with the above embodiment.

In the above embodiments, a plurality of light-receiving optical fibers 1082 surrounds a light-emitting optical fiber 1080. However, a plurality of light-emitting optical fibers 1080 can surround a light-receiving optical fiber 1082. As with the variation of the fifth embodiment, a lens may be attached to the light-emitting optical fiber 1080 and the plurality of light-receiving optical fibers 1082 so as to cover an emitting end and respective incident ends thereof.

Next, a substrate polishing apparatus 10 according to a seventh embodiment of the present invention will be described below. The substrate polishing apparatus 10 in the seventh embodiment basically has the same arrangement as the substrate polishing apparatus 10 in the second embodiment.

FIG. 25 is a cross-sectional view of light-emitting optical fibers 1080 and light-receiving optical fibers 1082 which are used in the substrate polishing apparatus 10 according to the seventh embodiment. In the present embodiment, the substrate polishing apparatus 10 has a plurality of light-emitting optical fibers 1080 and a plurality of light-receiving optical fibers 1082, which form an optical fiber member 1116. The plurality of light-emitting optical fibers 1080 and the plurality of light-receiving optical fibers 1082 are bundled together. Six light-emitting optical fibers 1080 or light-receiving optical fibers 1082 are disposed around a light-emitting optical fiber 1080 or light-receiving optical fiber 1082. The light-emitting optical fibers 1080 and the light-receiving optical fibers 1082 are arranged so that two to four light-receiving optical fibers 1082 are present around a light-emitting optical fiber 1080, and that two to four light-emitting optical fibers 1080 are present around a light-receiving optical fiber 1082.

Thus, a proper number of light-receiving optical fibers 1082 are disposed around a light-emitting optical fiber 1080, and a proper number of light-emitting optical fibers 1080 are disposed around a light-receiving optical fiber 1082. Accordingly, it is possible to increase a ratio of receiving measurement light by the light-receiving optical fibers 1082 and to improve an S/N ratio. Preferably, optical fibers disposed around light-emitting optical fibers 1080 contain 30-70% light-receiving optical fibers 1082, and optical fibers disposed around light-receiving optical fibers 1082 contain 30-70% light-emitting optical fibers 1080. When the light-emitting optical fibers 1080 and light-receiving optical fibers 1082 are disposed at the above rates, it is possible to increase a ratio of receiving measurement light and to improve an S/N ratio.

Next, a substrate polishing apparatus 10 according to an eighth embodiment of the present invention will be described below. The substrate polishing apparatus 10 in the eighth embodiment basically has the same arrangement as the substrate polishing apparatus 10 in the second embodiment.

Figure 26:
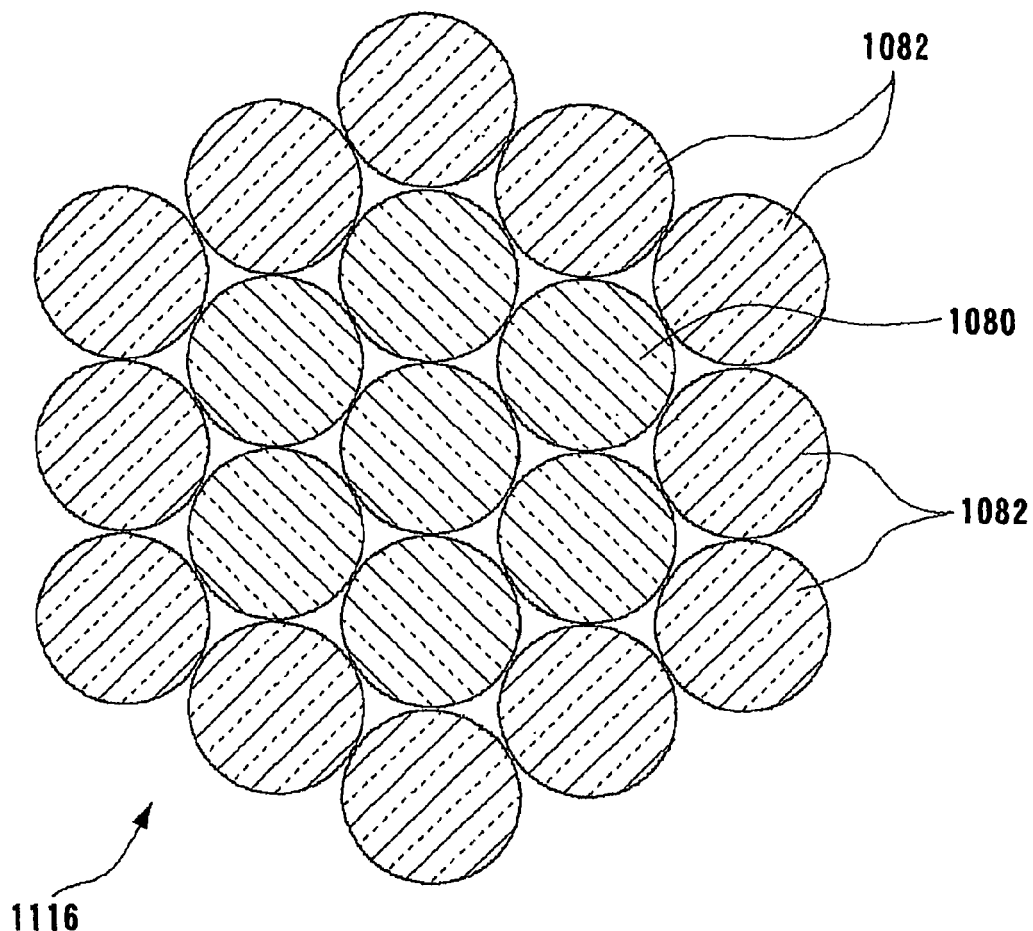
FIG. 26 is a cross-sectional view of light-emitting optical fibers and light-receiving optical fibers which are used in an eighth embodiment of the present invention.

FIG. 26 is a cross-sectional view of light-emitting optical fibers 1080 and light-receiving optical fibers 1082 which are used in the substrate polishing apparatus 10 according to the eighth embodiment. In the eighth embodiment, a plurality of light-emitting optical fibers 1080 and a plurality of light-receiving optical fibers 1082 are bundled together, as with the seventh embodiment, and form an optical fiber member 1116. In the eighth embodiment, a bundle of a plurality of light-emitting optical fibers 1080 is surrounded by the plurality of light-receiving optical fibers 1082.

Figure 27:
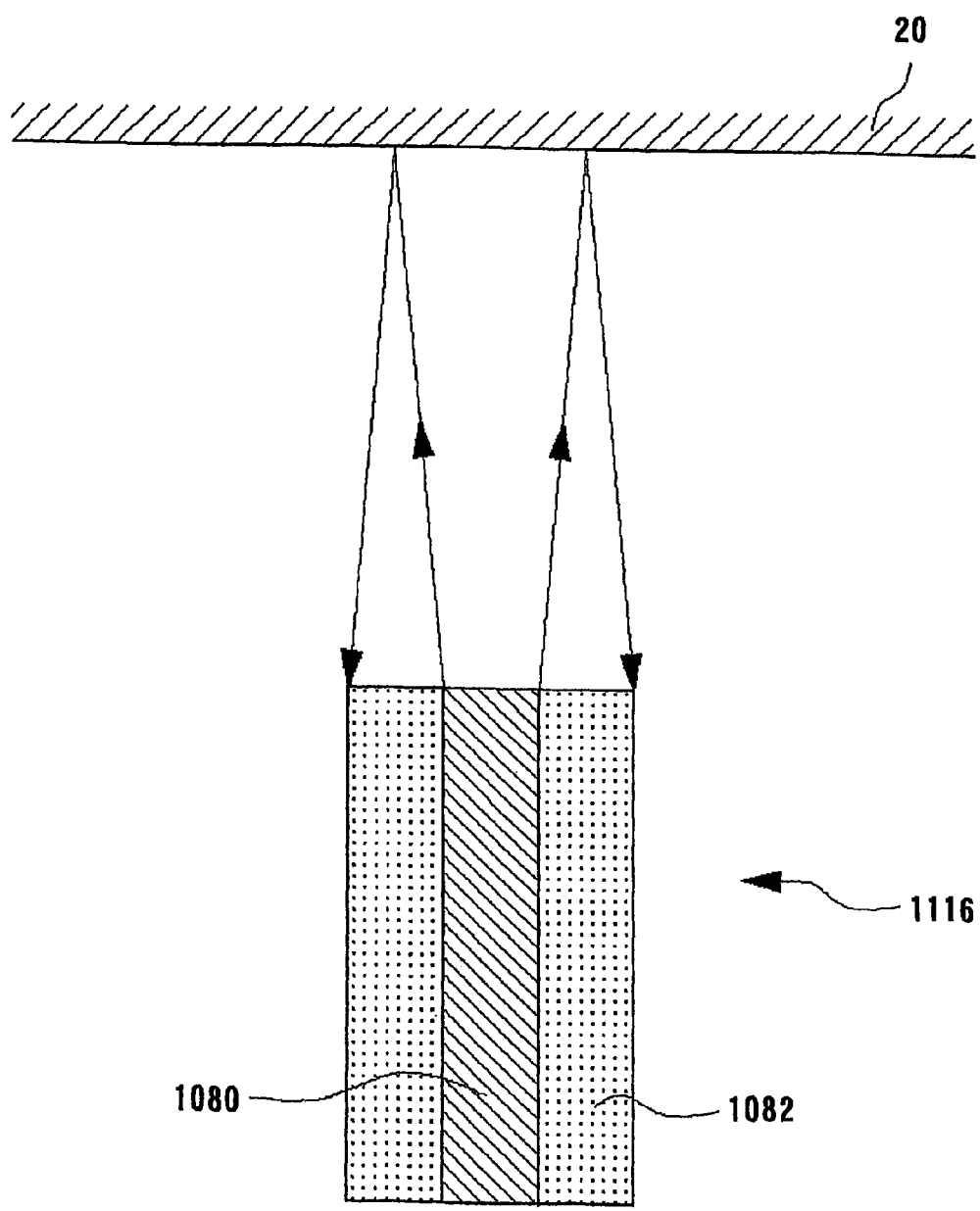
FIG. 27 is a schematic diagram showing paths of measurement light in the eighth embodiment.

FIG. 27 is a schematic diagram showing paths of measurement light in the eighth embodiment. As shown in FIG. 27, with an arrangement in which a plurality of light-emitting optical fibers 1080 is surrounded by a plurality of light-receiving optical fibers 1082, it is possible to improve a light-receiving efficiency of reflected light by the light-receiving optical fibers 1082. Further, since the light-emitting optical fibers 1080 are bundled, it is possible to restrict a range to which measurement light is applied from the light-emitting optical fibers 1080.

Figure 28:
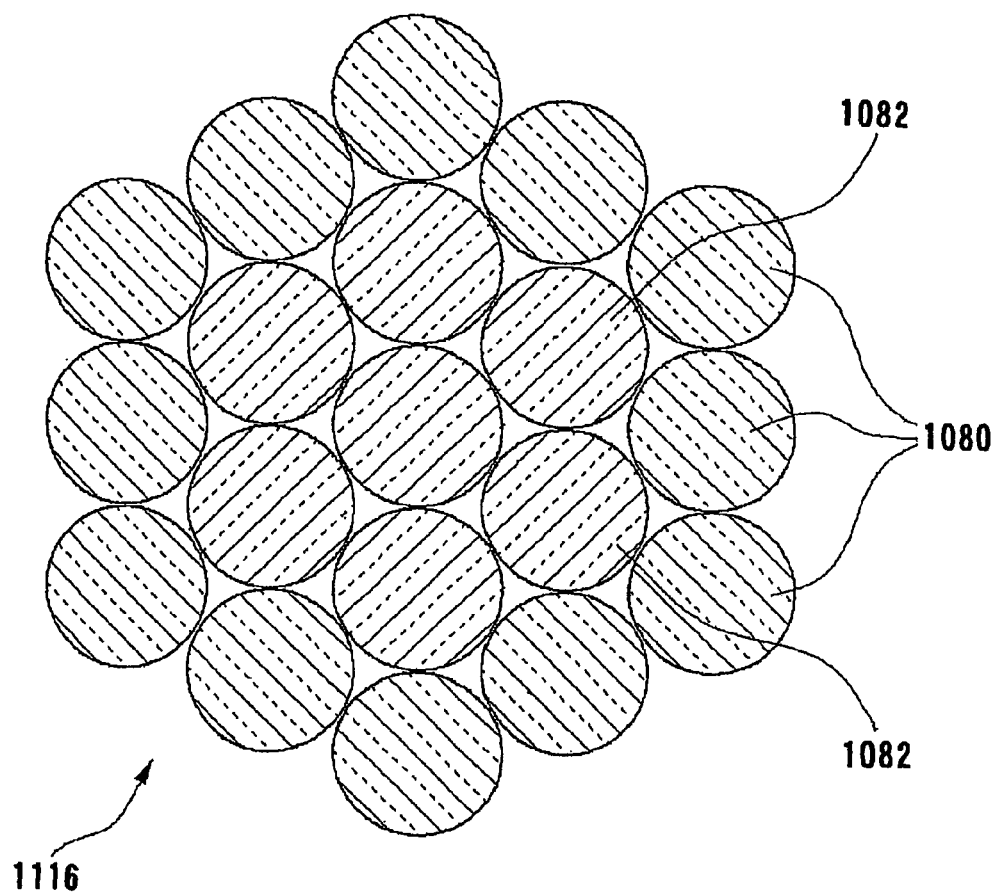
FIG. 28 is a cross-sectional view of light-emitting optical fibers and light-receiving optical fibers which are used in a variation of the eighth embodiment.

FIG. 28 is a cross-sectional view of light-emitting optical fibers 1080 and light-receiving optical fibers 1082 which are used in a variation of the eighth embodiment. In this variation, a bundle of a plurality of light-receiving optical fibers 1082 is surrounded by a plurality of light-emitting optical fibers 1080. With this arrangement, it is possible to improve a light-receiving efficiency of measurement light by the light-receiving optical fibers 1082.

As described above, the light-emitting optical fibers 1080 and the light-receiving optical fibers 1082 are disposed in a supply passage 42 for a measurement fluid. Accordingly, paths of measurement light may be influenced by a polishing abrasive mixed in the measurement fluid. In this variation, since the light-emitting optical fibers 1080 are disposed around the light-receiving optical fibers 1082, reflected light can be received in every direction around the light-receiving optical fibers 1082, so that the paths of measurement light are unlikely to be influenced by a polishing abrasive.

Next, a substrate polishing apparatus 10 according to a ninth embodiment of the present invention will be described below. The substrate polishing apparatus 10 in the ninth embodiment basically has the same arrangement as the substrate polishing apparatus 10 in the second embodiment.

Figure 29:
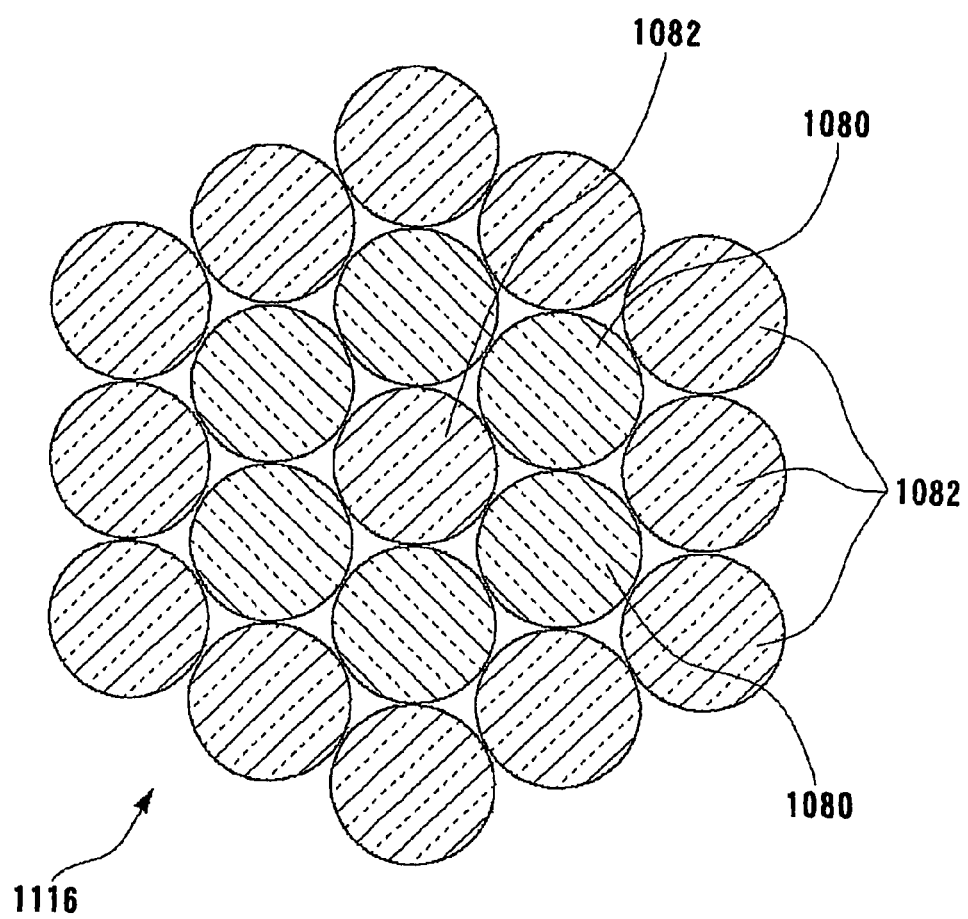
FIG. 29 is a cross-sectional view of light-emitting optical fibers and light-receiving optical fibers which are used in a ninth embodiment of the present invention.

FIG. 29 is a cross-sectional view of light-emitting optical fibers 1080 and light-receiving optical fibers 1082 which are used in the substrate polishing apparatus 10 according to the ninth embodiment. The light-emitting optical fibers 1080 and the light-receiving optical fibers 1082 form an optical fiber member 1116. In the ninth embodiment, a plurality of light-emitting optical fibers 1080 and a plurality of light-receiving optical fibers 1082 are bundled together, as with the seventh embodiment. In the ninth embodiment, a plurality of light-emitting optical fibers 1080 surrounds a light-receiving optical fiber 1082, and light-receiving optical fibers 1082 surround the plurality of optical fibers 1080. With this arrangement, it is possible to improve a light-receiving efficiency of measurement light by the light-receiving optical fibers 1082.

Figure 30:
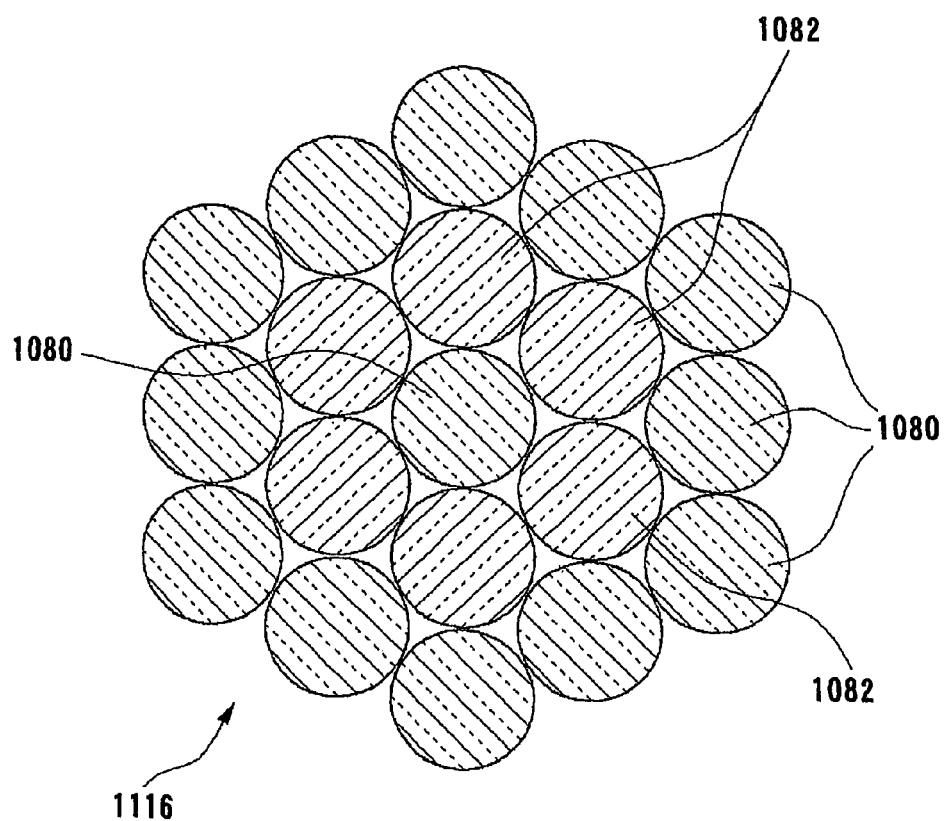
FIG. 30 is a cross-sectional view of light-emitting optical fibers and light-receiving optical fibers which are used in a variation of the ninth embodiment.

FIG. 30 is a cross-sectional view of light-emitting optical fibers 1080 and light-receiving optical fibers 1082 which are used in a variation of the ninth embodiment. The light-emitting optical fibers 1080 and the light-receiving optical fibers 1082 form an optical fiber member 1116. In this variation, an arrangement of the light-emitting optical fibers 1080 and the light-receiving optical fibers 1082 is opposite from that in the ninth embodiment. Specifically, a plurality of light-receiving optical fibers 1082 surrounds a light-emitting optical fiber 1080, and light-emitting optical fibers 1080 surround the plurality of optical fibers 1082. With this variation, it is possible to improve a light-receiving efficiency of measurement light by the light-receiving optical fibers 1082, as with the ninth embodiment.

Next, a substrate polishing apparatus 10 according to a tenth embodiment of the present invention will be described below. The substrate polishing apparatus 10 in the tenth embodiment basically has the same arrangement as the substrate polishing apparatus 10 in the second embodiment.

Figure 31:
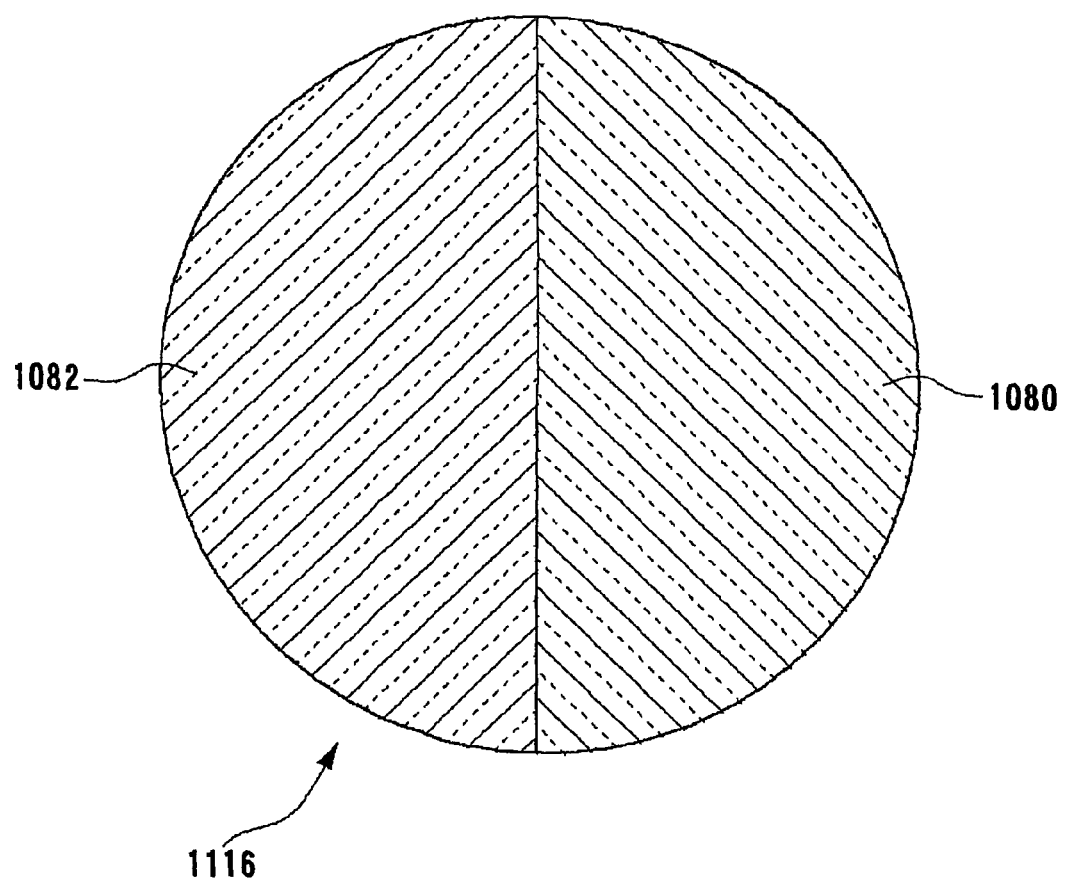
FIG. 31 is a cross-sectional view of an optical fiber member used in a tenth embodiment of the present invention.

FIG. 31 is a cross-sectional view showing an optical fiber member 1116 to emit measurement light and receive reflected light in the substrate polishing apparatus 10 according to the tenth embodiment. In the tenth embodiment, there is formed a composite optical fiber member 1116 having a divided region of a light-emitting optical fiber 1080 and a divided region of a light-receiving optical fiber 1082. Specifically, the optical fiber member 1116 has a light-emitting optical fiber region 1080 having a semicircular cross-section and a light-receiving optical fiber region 1082 having a semicircular cross-section. These respective regions are separated from each other by a common clad. This optical fiber member 1116 achieves a function as a light-emitting optical fiber 1080 and a function as a light-receiving optical fiber 1082.

This arrangement allows the light-emitting optical fiber region 1080 and the light-receiving optical fiber region 1082 to be located adjacent each other via the common clad. With this arrangement, since there is a small interval between a core of the light-emitting optical fiber region 1080 and a core of the light-receiving optical fiber region 1082, it is possible to enlarge an overlapping area of an application area by the light-emitting optical fiber region 1080 and a light-receivable area by the light-receiving optical fiber region 1082. Accordingly, the light-emitting optical fiber region 1080 and the light-receiving optical fiber region 1082 can be brought closer to substrate 20.

Further, a lens may be attached to ends of the light-emitting optical fiber region 1080 and the light-receiving optical fiber region 1082 so as to cover the light-emitting optical fiber region 1080 and the light-receiving optical fiber region 1082, as with the fifth embodiment.

Thus, a substrate polishing apparatus 10 according to the present invention has been described in detail with preferred embodiments. However, the present invention is not limited to the above embodiments.

In the above embodiments, positions at which the light-emitting optical fiber 1080 and the light-receiving optical fiber 1082 are disposed are calculated based on an angle of divergence, and the light-emitting optical fiber 1080 and the light-receiving optical fiber 1082 are disposed at these calculated positions. However, positions at which the light-emitting optical fiber 1080 and the light-receiving optical fiber 1082 are disposed may not be fixed. A light-emitting optical fiber and a light-receiving optical fiber may be connected to a driving device such as a precision ball screw or a piezoelectric element, and positions of a light-emitting optical fiber and a light-receiving optical fiber may be adjusted based on an optimal distance L from a substrate, which is calculated as with the above embodiments. With this arrangement, positions of the light-emitting optical fiber and the light-receiving optical fiber can be controlled in a feed-back manner according to degree of abrasion of a polishing pad during polishing.

Although certain preferred embodiments of the present invention have been described above, it should be understood that the present invention is not limited to the above embodiments, and that various changes and modifications may be made therein without departing from the scope of the technical concept.

As described above, according to the present invention illustrated in FIGS. 11 through 31, with an arrangement in which an emitting end of a light-emitting optical fiber and an incident end of a light-receiving optical fiber are located adjacent each other, a path of measurement light emitted from the light-emitting optical fiber and entering the light-receiving optical fiber becomes substantially perpendicular to a substrate. Therefore, it is possible to increase a quantity of light received by the light-receiving optical fiber.

According to the present invention, attention is drawn to the fact that an effective application area can be represented by angles of divergence of a light-emitting optical fiber and a light-receiving optical fiber. Thus, a distance from the light-emitting optical fiber and the light-receiving optical fiber is determined based on an angle of divergence. As a result, the light-emitting optical fiber and the light-receiving optical fiber can be located at optimal positions in view of enhancing a light-receiving efficiency.

Although certain preferred embodiments of the present invention have been shown and described in detail, it should be understood that various changes and modifications may be made therein without departing from the scope of the appended claims.

INDUSTRIAL APPLICABILITY

The present invention is suitable for use in a substrate polishing apparatus capable of reducing influence on a polishing process from substrate measurement, and improving measurement accuracy of a substrate measuring device.

The invention claimed is:

1. A substrate polishing apparatus comprising:
a polishing table for having a substrate pressed there against;
a light-emitting and light-receiving device to emit measurement light from said polishing table to the substrate and to receive reflected light from the substrate for measuring a film on the substrate;
a fluid supply passage for supplying a measurement fluid to a fluid chamber provided at a light-emitting and light-receiving position of said polishing table, wherein the measurement light and the reflected light are to pass through the measurement fluid; and
a fluid supply control device for controlling supply of the measurement fluid to said fluid chamber according to a positional relationship between said fluid chamber and the substrate.

2. A substrate polishing apparatus comprising:
a polishing table for having a substrate pressed there against;
a light-emitting and light-receiving device to emit measurement light from said polishing table to the substrate and to receive reflected light from the substrate for measuring a film on the substrate;
a fluid supply passage for supplying a measurement fluid to a fluid chamber provided at a light-emitting and light-receiving position of said polishing table, wherein the measurement light and the reflected light are to pass through the measurement fluid; and
a fluid supply light control device comprising means for controlling supply of the measurement fluid to said fluid chamber by causing the measurement fluid to be ejected to said fluid chamber during a blocking period during which said fluid chamber is blocked by the substrate.

3. The substrate polishing apparatus according to claim 2, wherein
said means controls supply of the measurement fluid to said fluid chamber by causing, during an unblocking period during which said fluid chamber is not blocked by the substrate, the measurement fluid to be supplied to said fluid chamber at a flow rate lower than a flow rate during ejection of the measurement fluid to said fluid chamber during the blocking period.

4. A substrate polishing apparatus comprising:
a polishing table for having a substrate pressed there against;
a light-emitting and light-receiving device to emit measurement light from said polishing table to the substrate and to receive reflected light from the substrate for measuring a film on the substrate;
a fluid supply passage for supplying a measurement fluid to a fluid chamber provided at a light-emitting and light-receiving position of said polishing table, wherein the measurement light and the reflected light are to pass through the measurement fluid;
a fluid supply control device comprising means for controlling supply of the measurement fluid to said fluid chamber; and
a compulsory discharge control means for controlling compulsory discharge of fluid from said fluid chamber according to a positional relationship between said fluid chamber and the substrate.

5. The substrate polishing apparatus according to claim 4, wherein
said compulsory discharge control means controls compulsory discharge of fluid from said fluid chamber by causing the fluid in said fluid chamber to be compulsorily discharged from said fluid chamber during a blocking period during which said fluid chamber is blocked by the substrate.

6. The substrate polishing apparatus according to claim 5, wherein
said compulsory discharge control means controls compulsory discharge of fluid from said fluid chamber by causing the fluid in said fluid chamber to be continuously compulsorily discharged during a predetermined post-blocking period after completion of the blocking period.

7. The substrate polishing apparatus according to claim 4, wherein
said compulsory discharge control means controls compulsory discharge of fluid from said fluid chamber by causing compulsory discharge of the fluid from said fluid chamber to be restricted during a predetermined pre-blocking period before initiation of the blocking period.

8. A substrate polishing apparatus comprising:
a polishing table for having a substrate pressed there against;
a light-emitting and light-receiving device to emit light from said polishing table to the substrate and to receive reflected light from the substrate;
a first passage for ejection, said first passage for introducing a fluid, through which the light and the reflected light is to pass, into a fluid chamber provided at a light-emitting and light-receiving position of said polishing table;
a second passage for a low flow rate into said fluid chamber, said second passage being restricted as compared to said first passage; and
a switching means for switching flow of the fluid through one of said first and second passages to flow of the fluid through the other of said first and second passages.

9. A substrate polishing apparatus comprising:
a polishing table having a polishing surface for polishing a semiconductor substrate;
a light-emitting optical fiber for emitting measurement light, for measuring a film of the semiconductor substrate, through an opening provided in said polishing surface to the semiconductor substrate; and
a light-receiving optical fiber for receiving the measurement light that is reflected from the semiconductor substrate,
wherein an emitting end of said light-emitting optical fiber and an incident end of said light-receiving optical fiber are located adjacent each other, and a distance from said light-emitting optical fiber and said light-receiving optical fiber to the semiconductor substrate is based on an angle of divergence of said light-emitting optical fiber and an angle of divergence of said light-receiving optical fiber.

10. A substrate polishing apparatus comprising:
a polishing table having a polishing surface for polishing a semiconductor substrate;
a light-emitting optical fiber for emitting measurement light, for measuring a film of the semiconductor substrate, through an opening provided in said polishing surface to the semiconductor substrate; and
a light-receiving optical fiber for receiving the measurement light that is reflected from the semiconductor substrate,
wherein an emitting end of said light-emitting optical fiber and an incident end of said light-receiving optical fiber are located adjacent each other, and a distance from said light-emitting optical fiber and said light-receiving optical fiber to the semiconductor substrate is based on an angle of divergence of said light-emitting optical fiber and an angle of divergence of said light-receiving optical fiber; and wherein the distance from said light-emitting optical fiber and said light-receiving optical fiber to the semiconductor substrate is based on a value L calculated from $$L=(1-N^2)^{1/2} \times (2T+C)/2N,$$

where N is a numerical aperture of said light-emitting optical fiber and said light-receiving optical fiber, C is a core diameter of said light-emitting optical fiber and said light-receiving optical fiber, and T is a thickness of a clad of said light-emitting optical fiber and said light-receiving optical fiber.

11. The substrate polishing apparatus according to claim 9, further comprising:
   at least one of
   (i) light-emitting condensation structure for condensing measurement light emitted by said light-emitting optical fiber to the semiconductor substrate, with said light-emitting condensation structure covering said emitting end of said light-emitting optical fiber, and
   (ii) light-receiving condensation structure for condensing measurement light reflected from the semiconductor substrate to said light-receiving optical fiber, with said light-receiving condensation structure covering said incident end of said light-receiving optical fiber.

12. The substrate polishing apparatus according to claim 9, wherein
   one of said light-emitting optical fiber and said light-receiving optical fiber is surrounded by the other of said light-emitting optical fiber and said light-receiving optical fiber.

13. A substrate polishing apparatus comprising:
   a polishing table having a polishing surface for polishing a semiconductor substrate;
   a light-emitting optical fiber for emitting measurement light, for measuring a film of the semiconductor substrate, through an opening in said polishing surface to the semiconductor substrate; and
   a light-receiving optical fiber for receiving the measurement light that is reflected from the semiconductor substrate,
   wherein an optical axis of said light-emitting optical fiber and an optical axis of said light-receiving optical fiber are inclined with respect to each other.

14. The substrate polishing apparatus according to claim 9, wherein
   said optical axis of said light-emitting optical fiber and said optical axis of said light-receiving optical fiber are symmetrical with respect to a normal line of the semiconductor substrate.

15. A substrate polishing apparatus comprising:
   a polishing table having a polishing surface for polishing a semiconductor substrate; and
   an optical fiber member for emitting measurement light, for measuring a film of the semiconductor substrate, through an opening in said polishing surface to the semiconductor substrate, and for receiving the measurement light that is reflected from the semiconductor substrate,
   wherein said optical fiber member includes at least one light-emitting optical fiber and at least one light-receiving optical fiber, with one of said at least one light-emitting optical fiber and said at least one light-receiving optical fiber being surrounded by the other of said at least one light-emitting optical fiber and said at least one light-receiving optical fiber.

16. The substrate polishing apparatus according to claim 15, wherein
   one of said at least one light-emitting optical fiber and said at least one light-receiving optical fiber covers the other of said at least one light-emitting optical fiber and said at least one light-receiving optical fiber.

17. A substrate polishing apparatus comprising:
   a polishing table having a polishing surface for polishing a semiconductor substrate; and
   an optical fiber member for emitting measurement light, for measuring a film of the semiconductor substrate, through an opening in said polishing surface to the semiconductor substrate, and for receiving the measurement light that is reflected from the semiconductor substrate,
   wherein said optical fiber member includes light-emitting optical fibers and light-receiving optical fibers, with said light-emitting optical fibers and said light-receiving optical fibers being bundled together.

18. A substrate polishing apparatus comprising:
   a polishing table having a polishing surface for polishing a semiconductor substrate; and
   an optical fiber member for emitting measurement light, for measuring a film of the semiconductor substrate, through an opening in said polishing surface to the semiconductor substrate, and for receiving the measurement light that is reflected from the semiconductor substrate,
   wherein said optical fiber member comprises a composite optical fiber having divided cross-sections including a region of a light-emitting optical fiber and a region of a light-receiving optical fiber.

* * * * *

UNITED STATES PATENT AND TRADEMARK OFFICE
CERTIFICATE OF CORRECTION

PATENT NO.       : 7,547,242 B2                                    Page 1 of 1
APPLICATION NO.  : 10/558257
DATED            : June 16, 2009
INVENTOR(S)      : Kazuto Hirokawa et al.

It is certified that error appears in the above-identified patent and that said Letters Patent is hereby corrected as shown below:

<u>Column 33</u>
In line 30, the phrase "a fluid supply light control" should read --a fluid supply control--.

<u>Column 35</u>
In line 50, the phrase "according to claim 9" should read --according to claim 13--.

Signed and Sealed this

Eighteenth Day of August, 2009

David J. Kappos
*Director of the United States Patent and Trademark Office*